(12) United States Patent
Parikh et al.

(10) Patent No.: US 12,495,582 B2
(45) Date of Patent: Dec. 9, 2025

(54) SELF-ALIGNED WIDE BACKSIDE POWER RAIL CONTACTS TO MULTIPLE TRANSISTOR SOURCES

(71) Applicant: Applied Materials, Inc., Santa Clara, CA (US)

(72) Inventors: Suketu Arun Parikh, San Jose, CA (US); Ashish Pal, San Ramon, CA (US); El Mehdi Bazizi, San Jose, CA (US); Andrew Yeoh, Portland, OR (US); Nitin K. Ingle, San Jose, CA (US); Arvind Sundarrajan, Singapore (SG); Guan Huei See, Singapore (SG); Martinus Maria Berkens, Eindhoven (NL); Sameer A. Deshpande, Santa Clara, CA (US); Balasubramanian Pranatharthiharan, San Jose, CA (US); Yen-Chu Yang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 549 days.

(21) Appl. No.: 17/897,375

(22) Filed: Aug. 29, 2022

(65) Prior Publication Data
US 2023/0064183 A1 Mar. 2, 2023

Related U.S. Application Data

(60) Provisional application No. 63/240,187, filed on Sep. 2, 2021, provisional application No. 63/240,178, filed
(Continued)

(51) Int. Cl.
*H10D 30/67* (2025.01)
*H10D 84/01* (2025.01)
*H10D 84/03* (2025.01)

(52) U.S. Cl.
CPC ..... *H10D 30/6748* (2025.01); *H10D 30/6735* (2025.01); *H10D 84/0149* (2025.01); *H10D 84/038* (2025.01)

(58) Field of Classification Search
CPC ............. H10D 30/6748; H10D 84/038; H10D 30/6735; H10D 84/0149; H10D 30/43;
(Continued)

(56) References Cited

U.S. PATENT DOCUMENTS

2004/0000268 A1* 1/2004 Wu ................... H01L 21/02532
257/E21.129
2013/0049215 A1 2/2013 Larsen
(Continued)

FOREIGN PATENT DOCUMENTS

CN 113206062 A 8/2021
CN 113299646 A 8/2021
(Continued)

OTHER PUBLICATIONS

PCT International Search Report and Written Opinion in PCT/US2022/042300 dated Dec. 19, 2022, 11 pages.
(Continued)

*Primary Examiner* — Changhyun Yi
(74) *Attorney, Agent, or Firm* — SERVILLA WHITNEY LLC

(57) ABSTRACT

A method of forming a semiconductor device is provided. The method includes forming a superlattice structure on a substrate and etching source and drain trenches adjacent to the superlattice structure. The source and drain trenches are expanded to form cavities, which are filled with a sacrificial material. A source region and a drain region are formed in the trenches. Contacts to the transistor and gate are formed. Backside processing is then performed by flipping the substrate, depositing an interlayer dielectric on the bottom
(Continued)

surface, and etching a backside power rail via that is expanded into a damascene trench. The sacrificial material is removed to create openings extending to the damascene trench, and a metal fill is deposited in the openings and trench.

20 Claims, 39 Drawing Sheets

Related U.S. Application Data on Sep. 2, 2021, provisional application No. 63/240,183, filed on Sep. 2, 2021.

(58) Field of Classification Search
CPC .............. H10D 30/6757; H10D 64/017; H01L 21/76251; H01L 21/304; H01L 21/76897; H01L 21/76898; H01L 21/76895
See application file for complete search history.

(56) References Cited

U.S. PATENT DOCUMENTS

| | | |
|---|---|---|
| 2013/0113068 A1 | 5/2013 | Ramachandran et al. |
| 2017/0098608 A1 | 4/2017 | Jung |
| 2018/0033718 A1 | 2/2018 | Kaltalioglu et al. |
| 2018/0294267 A1 | 10/2018 | Licausi et al. |
| 2018/0337112 A1 | 11/2018 | Chen et al. |
| 2019/0067091 A1 | 2/2019 | Morrow et al. |
| 2019/0123140 A1 | 4/2019 | Park et al. |
| 2019/0157310 A1 | 5/2019 | Glass et al. |
| 2019/0378842 A1 | 12/2019 | Reznicek et al. |
| 2020/0035560 A1 | 1/2020 | Block et al. |
| 2020/0052124 A1 | 2/2020 | Miao et al. |
| 2020/0161244 A1 | 5/2020 | Kao et al. |
| 2020/0219879 A1 | 7/2020 | Shin et al. |
| 2020/0294998 A1 | 9/2020 | Lilak et al. |
| 2020/0303509 A1 | 9/2020 | Mehandru et al. |
| 2020/0381546 A1 | 12/2020 | Cho et al. |
| 2021/0134721 A1 | 5/2021 | Chiang et al. |
| 2021/0184016 A1 | 6/2021 | Cheng et al. |
| 2021/0193829 A1 | 6/2021 | Reznicek et al. |
| 2021/0217699 A1 | 7/2021 | Zhu et al. |
| 2021/0265220 A1 | 8/2021 | Lee et al. |
| 2021/0375722 A1 | 12/2021 | Kim et al. |
| 2022/0367462 A1 | 11/2022 | Chiang et al. |
| 2024/0312995 A1* | 9/2024 | Huang ................ H01L 23/5286 |
| 2024/0379453 A1 | 11/2024 | Glass et al. |

FOREIGN PATENT DOCUMENTS

| | | |
|---|---|---|
| JP | H08181321 A | 7/1996 |
| JP | 2006140507 A | 6/2006 |
| JP | 2012028557 A | 2/2012 |
| JP | 2016031953 A | 3/2016 |
| KR | 20070067119 A | 6/2007 |
| WO | 2018039645 A1 | 3/2018 |
| WO | 2020171992 A1 | 8/2020 |

OTHER PUBLICATIONS

PCT International Search Report and Written Opinion in PCT/US2022/042301 dated Jan. 2, 2023, 11 pages.
PCT International Search Report and Written Opinion in PCT/US2022/042302 dated Dec. 21, 2022, 11 pages.

* cited by examiner

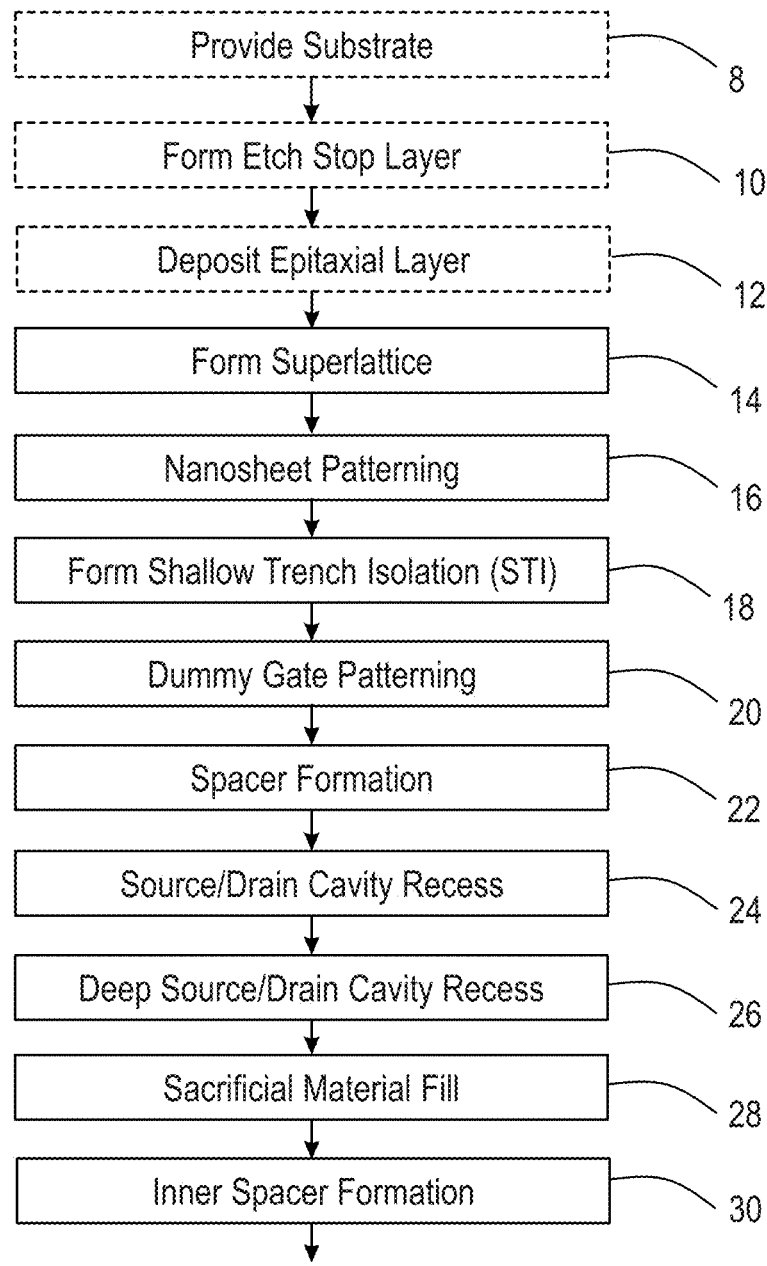
FIG. 1A (Cont...)

SELF-ALIGNED WIDE BACKSIDE POWER RAIL CONTACTS TO MULTIPLE TRANSISTOR SOURCES

CROSS-REFERENCE TO RELATED APPLICATIONS

This application claims priority to U.S. Provisional Application No. 63/240,183, filed Sep. 2, 2021, U.S. Provisional Application No. 63/240,178, filed Sep. 2, 2021, and U.S. Provisional Application No. 63/240,187, filed Sep. 2, 2021, the entire disclosures of which are hereby incorporated by reference herein.

TECHNICAL FIELD

Embodiments of the disclosure generally relate to semiconductor devices. More particularly, embodiments of the disclosure are directed to power rail architecture, 3D packaging, and methods of manufacturing semiconductor devices.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Semiconductor devices are typically fabricated by sequentially depositing insulating or dielectric layers, conductive layers, and semiconductor layers of material over a semiconductor substrate, and patterning the various material layers using lithography to form circuit components and elements thereon. The conductive layers facilitate electrical wiring to various electrical components including transistors, amplifiers, inverters, control logic, memory, power management circuits, buffers, filters, resonators, capacitors, inductors, resistors, and the like.

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing Connecting semiconductors to a power rail is typically done on the front of the cell, which requires significant cell area. Accordingly, there is a need for semiconductor devices which are connected to power rails using less cell area.

SUMMARY

One or more embodiments of the disclosure are directed to methods of forming a semiconductor device. In one or more embodiments, a method of forming a semiconductor device comprises: forming an etch stop layer on a top surface of a substrate, the substrate having a first thickness; forming an epitaxial layer on a top surface of the etch stop layer; forming a wafer device on a top surface of the epitaxial layer; bonding the wafer device to a bonding wafer; grinding the substrate to form a substrate having a second thickness less than the first thickness; planarizing the substrate to form a substrate having a third thickness less than the second thickness; removing the etch stop layer to expose a source/drain region on the wafer device; and forming a contact electrically connected to the source drain region.

Additional embodiments of the disclosure are directed to methods of forming a semiconductor device. In one or more embodiments, a method of forming a semiconductor device comprises: forming an etch stop layer on a top surface of a substrate, the substrate having a first thickness; forming an epitaxial layer on a top surface of the etch stop layer; forming a wafer device on a top surface of the epitaxial layer; bonding the wafer device to a bonding dummy wafer or Cu wafer with hybrid bonding; grinding the substrate to form a substrate having a second thickness less than the first thickness; depositing a mask layer on a bottom surface of the etch stop layer; forming at least one via opening in the mask layer; selectively removing the etch stop layer; and removing the mask layer to expose the substrate, the substrate having a fourth thickness less than the first thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A is a process flow diagram of a method according to one or more embodiments;

Figure 1B:
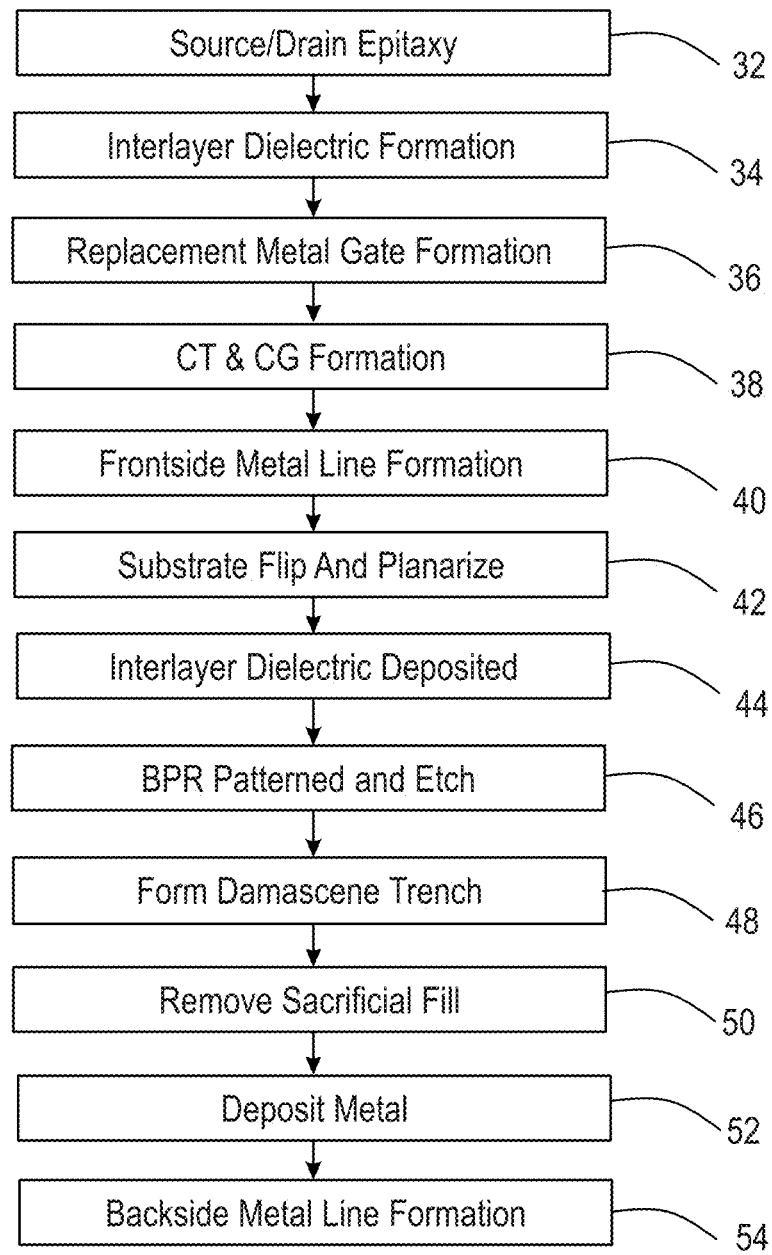
FIG. 1B is a continuation of the process flow diagram of FIG. 1A depicting a method according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate-all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. In the method of one or more embodiments, transistors, e.g., gate-all-around transistors, are fabricated using a standard process flow. In some embodiments, a silicon wafer is provided and a buried etch stop layer is formed on the silicon wafer. An epitaxial layer, e.g., epitaxial silicon, is deposited. The wafer is then subjected to device and front-end processing. After front-end processing, the wafer undergoes hybrid bonding, e.g., to copper or to an oxide, and then the wafer is advantageously thinned. Thinning the wafer provides desired flatness and bonding for making a back side power rail possible. To thin the wafer, the silicon substrate layer, which has a starting first thickness, is ground to a second thickness, the second thickness less than the first thickness. After grinding, in some embodiments, the silicon wafer is subjected to chemical mechanical planarization (CMP), followed by etching and CMP buffing, to reduce the thickness of the silicon to a third thickness, the third thickness less than the second thickness. In one or more embodiments, the etching stops at the buried etch stop layer. The contacts are then prefilled with a metal, and metallization is conducted.

In alternative embodiments, transistors, e.g., gate-all-around transistors, are fabricated using a standard process flow. In some embodiments, a silicon wafer is provided and a buried etch stop layer is formed on the silicon wafer. An epitaxial layer, e.g., epitaxial silicon, is deposited. The wafer is then subjected to device and front-end processing. After front-end processing, the wafer undergoes hybrid bonding, e.g., to copper or to an oxide, and then the wafer is advantageously thinned. Thinning the wafer provides desired flatness and bonding for making a back side power rail possible. To thin the wafer, the silicon substrate layer, which has a starting first thickness, is ground to a second thickness, the second thickness less than the first thickness. After grinding, a large mask is deposited and vias are formed in the mask. The wafer is then etched through the vias to the buried etch stop layer, and then the etch stop layer is selectively removed, and liftoff occurs.

In the method of one or more embodiments, transistors, e.g., gate-all-around transistors, are fabricated using a standard process flow. After the source/drain cavity is recessed, the dimension of the source/drain cavity is expanded, and a sacrificial fill material is deposited. Fabrication proceeds with formation of the inner spacer, source/drain epitaxy, formation of an interlayer dielectric, replacement gate formation, a contact to a transistor (CT) and a contact to the gate (CG) formation, and frontside metal line formation. The substrate is then flipped and planarized. An interlayer dielectric is deposited on the backside, backside power rail vias are patterned and the interlayer dielectric is etched. A damascene trench is formed, and the sacrificial fill is removed to form an opening. A metal is deposited in the opening, and then backside metal lines are formed. In one or more embodiments, the sacrificial fill material is advantageously selective so that, upon etching, self-aligned trenches and/or vias are formed, thus avoiding misalignment.

In the method of one or more embodiments, transistors, e.g., gate-all-around transistors, are fabricated using a standard process flow. Deep vias are etched with a separate mask, or alternately they are etched with regular contact or via mask. After etching regular vias, mask is placed and then power rail vias are etched to depth below device for ease of backside connection. Both standard and deep vias/contacts are filled simultaneously with titanium nitride/tungsten (TiN/W) or titanium nitride/ruthenium (TiN/Ru) or molybdenum (Mo) contact fill, followed by planarization. The wafer may be optionally thinned. One the backside, a via is etched to connect to the deep via. Metallization then occurs.

Figure 2A:
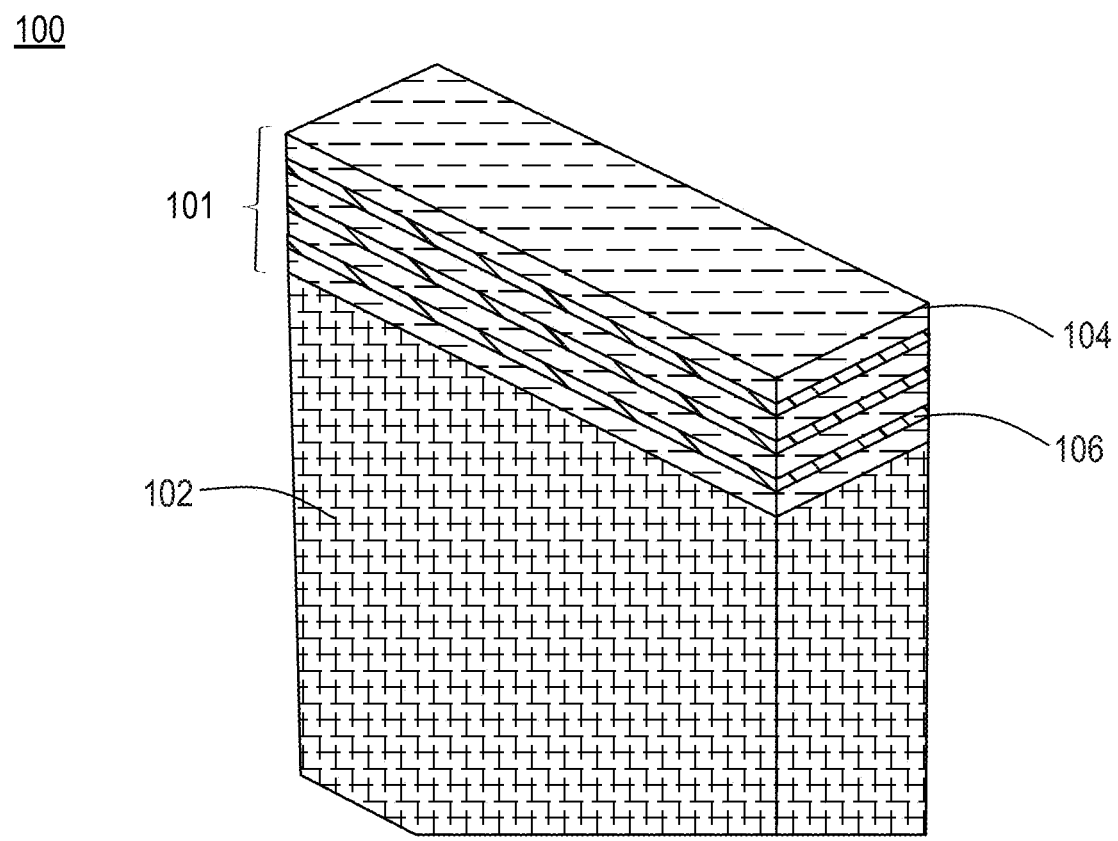
FIG. 2A illustrates a cross-section view of a device according to one or more embodiments.

FIG. 1A illustrates a process flow diagram for a method 6 for forming a semiconductor device in accordance with some embodiments of the present disclosure. FIG. 1B is a continuation of the process flow diagram of FIG. 1A depicting the method 6 according to one or more embodiments. FIGS. 2A-2U depict the stages of fabrication of semiconductor structures in accordance with some embodiments of the present disclosure. The method 6 is described below with respect to FIGS. 2A-2U. FIGS. 2A-2U are cross-sectional views of an electronic device (e.g., a GAA) according to one or more embodiments. The method 6 may be part of a multi-step fabrication process of a semiconductor device. Accordingly, the method 6 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

FIGS. 2A-2U are the fabrication steps of operations 8 through 54 in FIGS. 1A-1B. Referring to FIG. 1A, the method 6 of forming the device 100 begins at operation 8, by providing a substrate 102. In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 102 comprises a semiconductor material, e.g., silicon (Si), carbon (C), germanium (Ge), (silicon germanium (SiGe), germanium tin (GeSn), other semiconductor materials, or any combination thereof. In one or more embodiments, the substrate 102 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

With reference to FIG. 1A, in some unillustrated embodiments, at operation 10, an etch stop layer may be formed on a top surface of the substrate. The etch stop layer may comprise any suitable material known to the skilled artisan. In one or more embodiments, the etch stop layer comprises silicon germanium (SiGe). In one or more embodiments, the etch stop layer has a high germanium (Ge) content. In one or more embodiments, the amount of germanium is in a range of from 30% to 50%, including a range of from 35% to 45%. Without intending to be bound by theory, it is thought that the germanium content being in a range of from 30% to 50% leads to increased selectivity of the etch stop layer and minimizes stress defects. In one or more embodiments, the etch stop layer has a thickness in a range of from 5 nm to 30 nm. The etch stop layer may serve as an etch stop for planarization (e.g., CMP), dry or wet etch during backside processing.

In one or more unillustrated embodiments, at operation 12, an epitaxial layer, e.g., epitaxial silicon, may be deposited on the etch stop layer. The epitaxial layer may have a thickness is a range of from 20 nm to 100 nm.

Referring to FIG. 1A and FIG. 2A, in one or more embodiments, at operation 14, at least one superlattice structure 101 is formed atop the top surface of the substrate 102 or on a top surface of the etch stop layer and epitaxial layer. The superlattice structure 101 comprises a plurality of semiconductor material layers 106 and a corresponding plurality of horizontal channel layers 104 alternatingly arranged in a plurality of stacked pairs. In some embodiments the plurality of stacked groups of layers comprises a silicon (Si) and silicon germanium (SiGe) group. In some embodiments, the plurality of semiconductor material layers 106 comprise silicon germanium (SiGe), and the plurality of horizontal channel layers 104 comprise silicon (Si). In other embodiments, the plurality of horizontal channel layers 104 comprise silicon germanium (SiGe), and the plurality of semiconductor materials layers 106 comprise silicon (Si).

In some embodiments, the plurality of semiconductor material layers 106 and corresponding plurality of horizontal channel layers 104 can comprise any number of lattice matched material pairs suitable for forming a superlattice structure 204. In some embodiments, the plurality of semiconductor material layers 106 and corresponding plurality of horizontal channel layers 104 comprise from about 2 to about 50 pairs of lattice matched materials.

In one or more embodiments, the thickness of the plurality of semiconductor material layers 106 and the plurality of horizontal channel layers 104 are in the range of from about 2 nm to about 50 nm, in the range of from about 3 nm to about 20 nm, or in a range of from about 2 nm to about 15 nm.

Figure 2B:
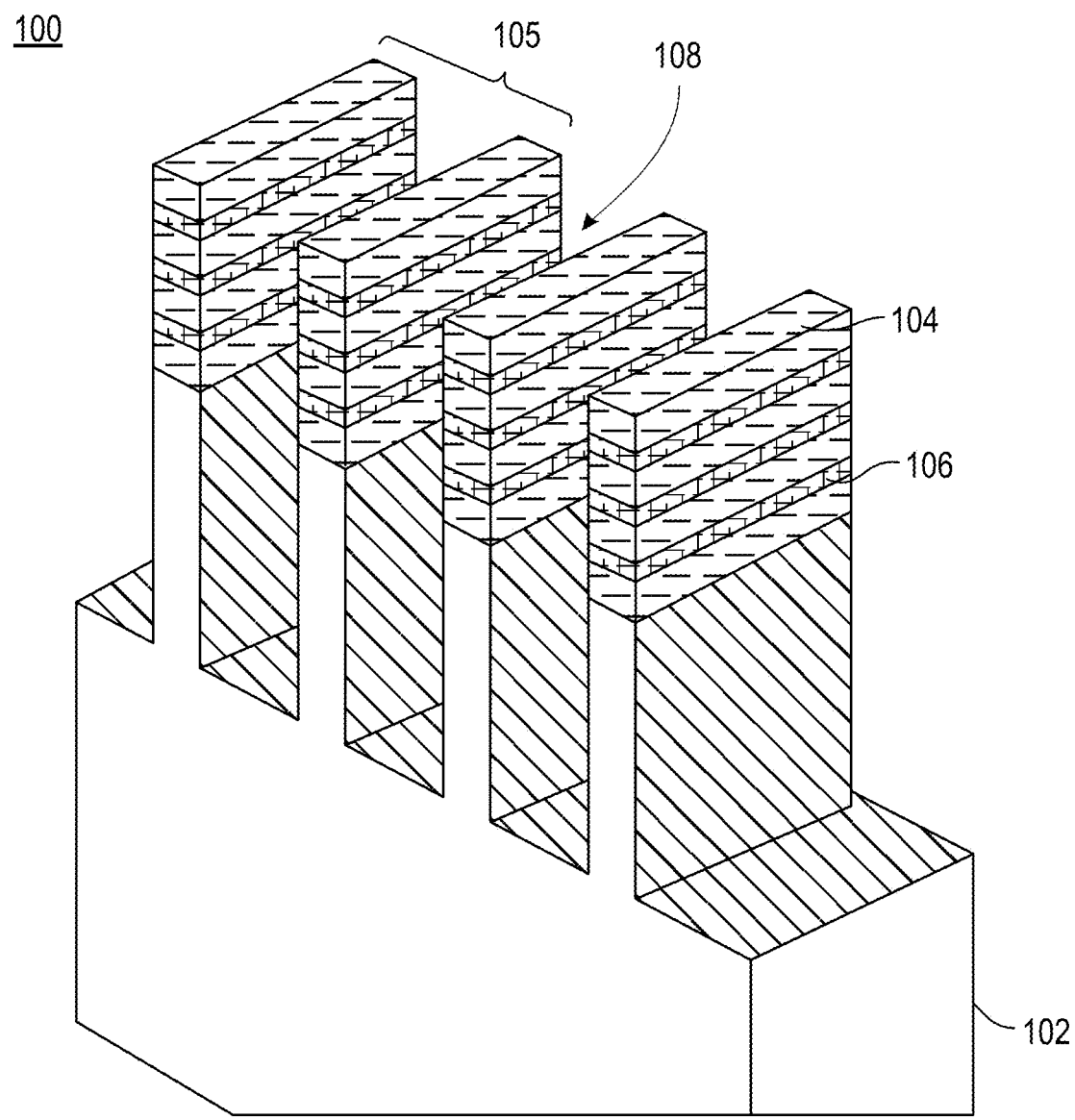
FIG. 2B illustrates a cross-section view of a device according to one or more embodiments.

With reference to FIG. 1A and FIG. 2B, in one or more embodiments, at operation 16, the superlattice structure 101 is patterned to form an opening 108 between adjacent stacks 105. The patterning may be done by any suitable means known to the skilled artisan. As used in this regard, the term "opening" means any intentional surface irregularity. Suitable examples of openings include, but are not limited to, trenches which have a top, two sidewalls and a bottom. Openings can have any suitable aspect ratio (ratio of the depth of the feature to the width of the feature). In some embodiments, the aspect ratio is greater than or equal to about 5:1, about 10:1, about 15:1, about 20:1, about 25:1, about 30:1, about 35:1 or about 40:1.

Figure 2C:
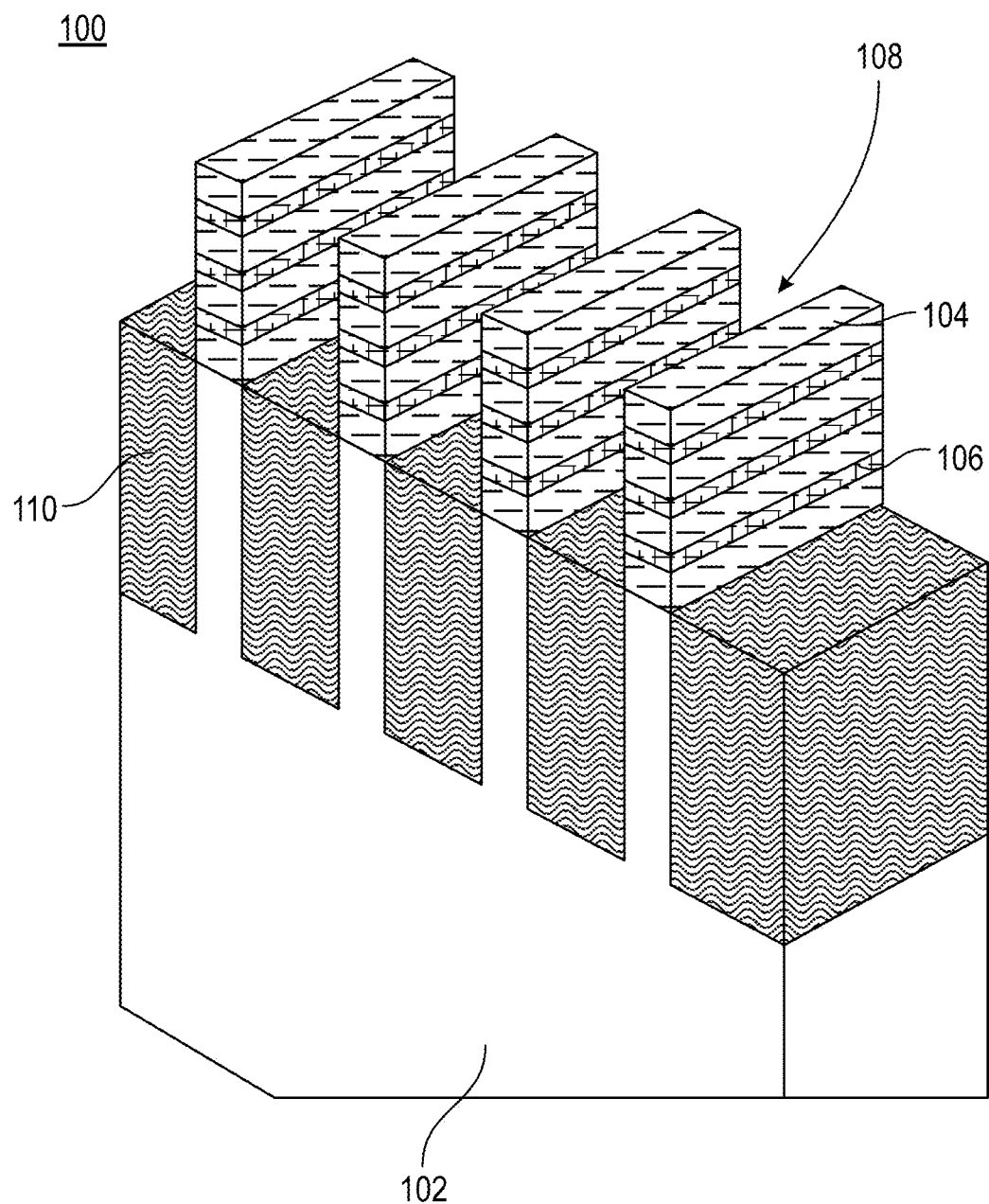
FIG. 2C illustrates a cross-section view of a device according to one or more embodiments.

Referring to FIG. 1A and FIG. 2C, at operation 18, a shallow trench isolation (STI) 110 is formed. As used herein, the term "shallow trench isolation (STI)" refers to an integrated circuit feature which prevents current leakage. In one or more embodiments, STI is created by depositing one or more dielectric materials (such as silicon dioxide) to fill the trench or opening 108 and removing the excess dielectric using a technique such as chemical-mechanical planarization.

Figure 2D:
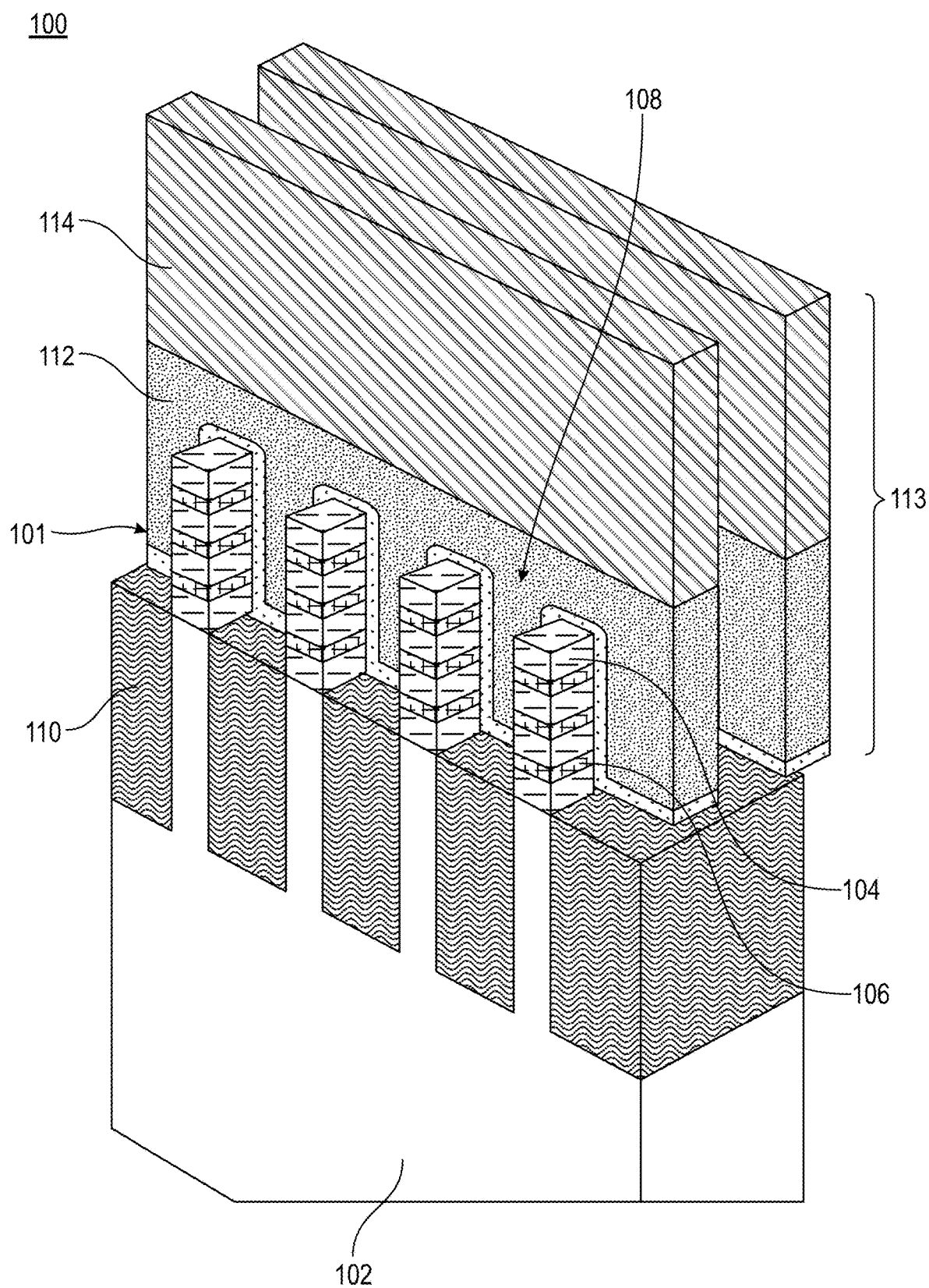
FIG. 2D illustrates a cross-section view of a device according to one or more embodiments.

With reference to FIG. 1A and FIG. 2D, in some embodiments, a replacement gate structure 113 (e.g., a dummy gate structure) is formed over and adjacent to the superlattice structure 101. The dummy gate structure 113 defines the channel region of the transistor device. The dummy gate structure 113 may be formed using any suitable conventional deposition and patterning process known in the art.

In one or more embodiments, the dummy gate structure comprises one or more of a gate 114 and a poly-silicon layer 112. In one or more embodiments, the dummy gate structure comprises one or more of tungsten (W), cobalt (Co), molybdenum (Mo), ruthenium (Ru), titanium nitride (TiN), tantalum nitride (TaN), titanium aluminum (TiAl), and n-doped polysilicon.

Figure 2E:
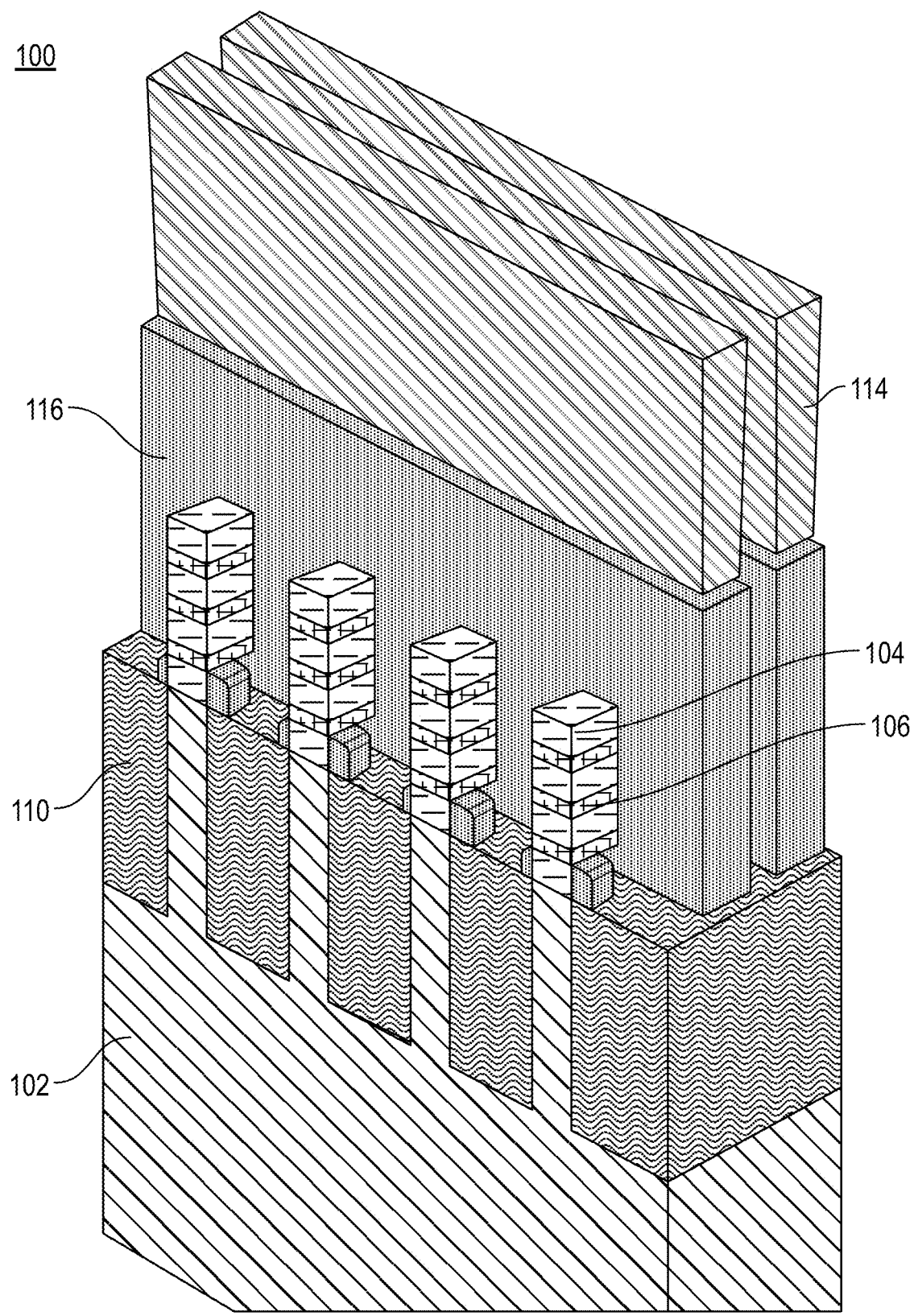
FIG. 2E illustrates a cross-section view of a device according to one or more embodiments.

Referring to FIG. 1A and FIG. 2E, in some embodiments, at operation 22, sidewall spacers 116 are formed along outer sidewalls of the dummy gate structure 113 and on the superlattice 101. The sidewall spacers 116 may comprise any suitable insulating materials known in the art, for example, silicon nitride, silicon oxide, silicon oxynitride, silicon carbide, or the like. In some embodiments, the sidewall spacers are formed using any suitable conventional deposition and patterning process known in the art, such as atomic layer deposition, plasma enhanced atomic layer deposition, plasma enhanced chemical vapor deposition, low-pressure chemical vapor deposition, or isotropic deposition.

Figure 2F:
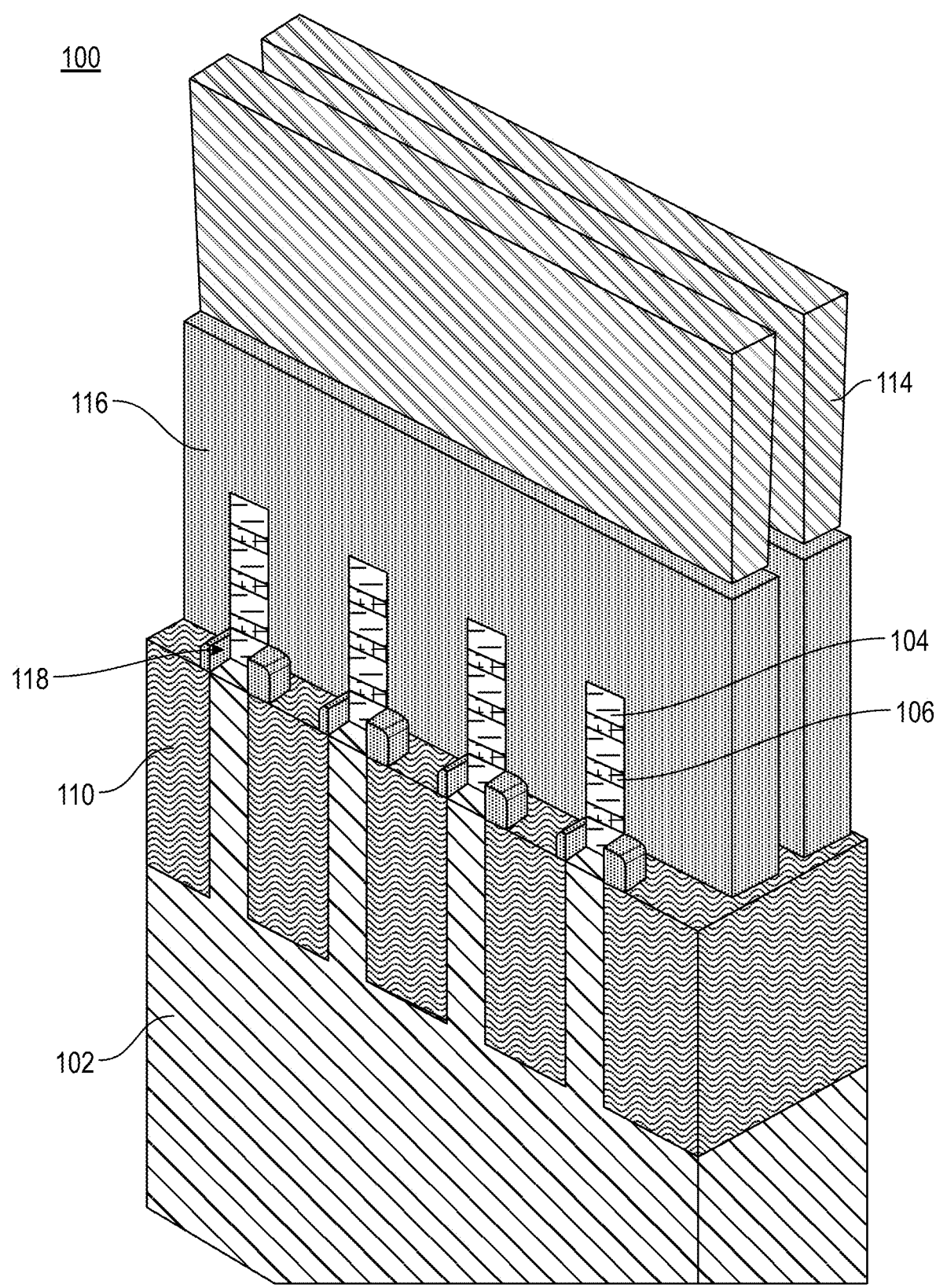
FIG. 2F illustrates a cross-section view of a device according to one or more embodiments.

Referring to FIG. 1A and FIG. 2F, at operation 24, in one or more embodiments, source/drain trenches 118 are formed adjacent (i.e., on either side) the superlattice structure 101.

Figure 2G:
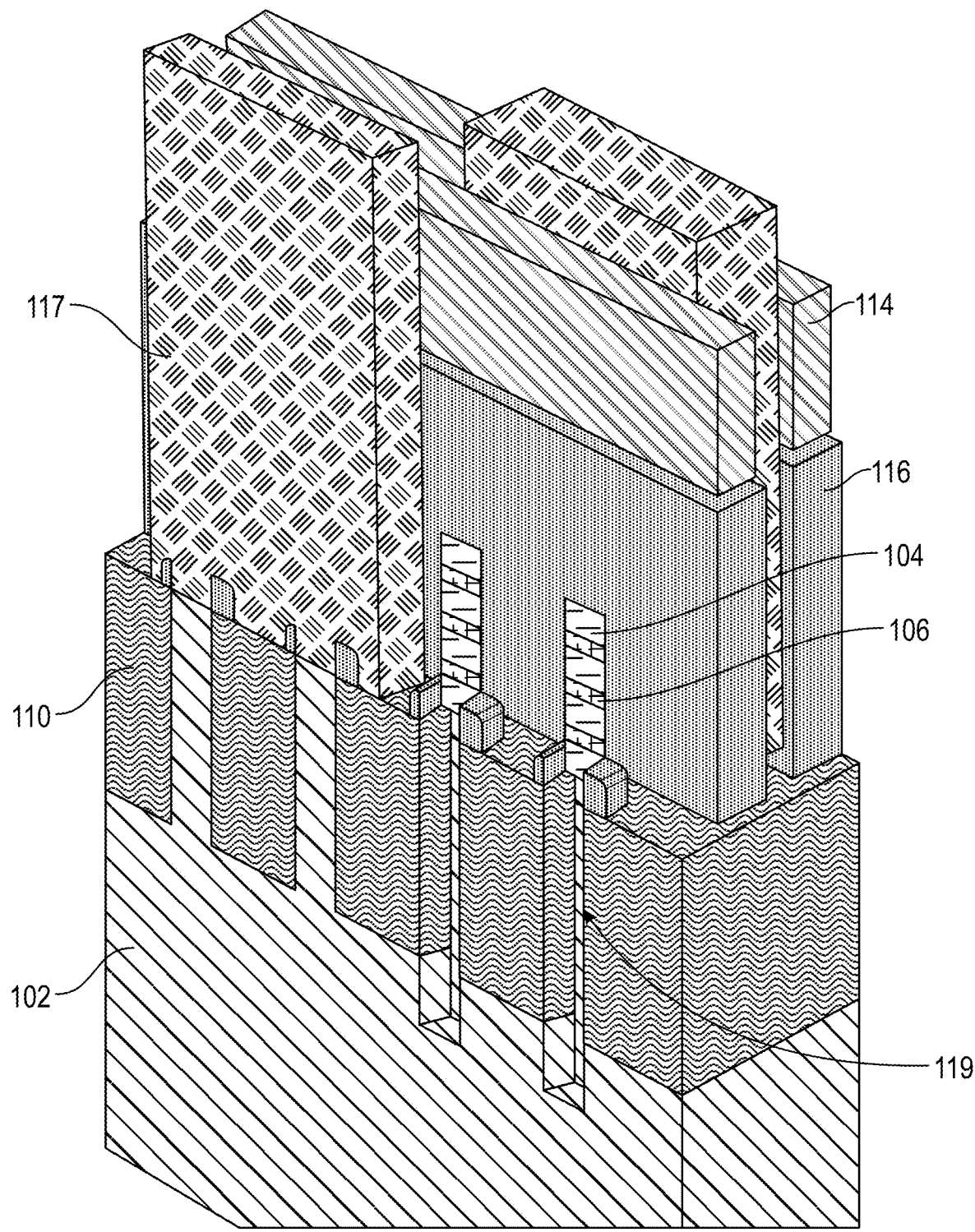
FIG. 2G illustrates a cross-section view of a device according to one or more embodiments.

With reference to FIG. 1A and FIG. 2G, at operation 26, in one or more embodiments, the source/drain trenches 118 are deepened and expanded to form cavities 119 under the superlattice structure 101. The cavities 119 may have any suitable depth and width. In one or more embodiments, the cavity 119 extends through the shallow trench isolation 110 into the substrate 102. In one or more embodiments, the cavity 119 etch and dummy fill extend below the shallow trench isolation 110 and maximally up to the silicon germanium (SiGe) etch stop layer, thus enabling self-aligned contacts without touching the device.

The cavity 119 may be formed by any suitable means known to the skilled artisan. In one or more embodiments, a hard mask 117 is deposited to block the non $V_{ss}/V_{dd}$ source/drain. In one or more embodiments, the hard mask 117 may comprise and suitable material known to the skill artisan. In some embodiments, the hard mask 117 is a resist. Once the hard mask 117 is formed, the cavity 119 is formed by etching.

The etch process of operation 26 may include any suitable etch process that is selective to the source drain trenches 118. In some embodiments the etch process of operation 26 comprises one or more of a wet etch process or a dry etch process. The etch process may be a directional etch.

In some embodiments, the dry etch process may include a conventional plasma etch, or a remote plasma-assisted dry etch process. In a remote plasma-assisted dry etch process, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The etch process may be performed in a Preclean chamber, which may be integrated into one of a variety of multi-processing platforms. The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

Figure 2H:
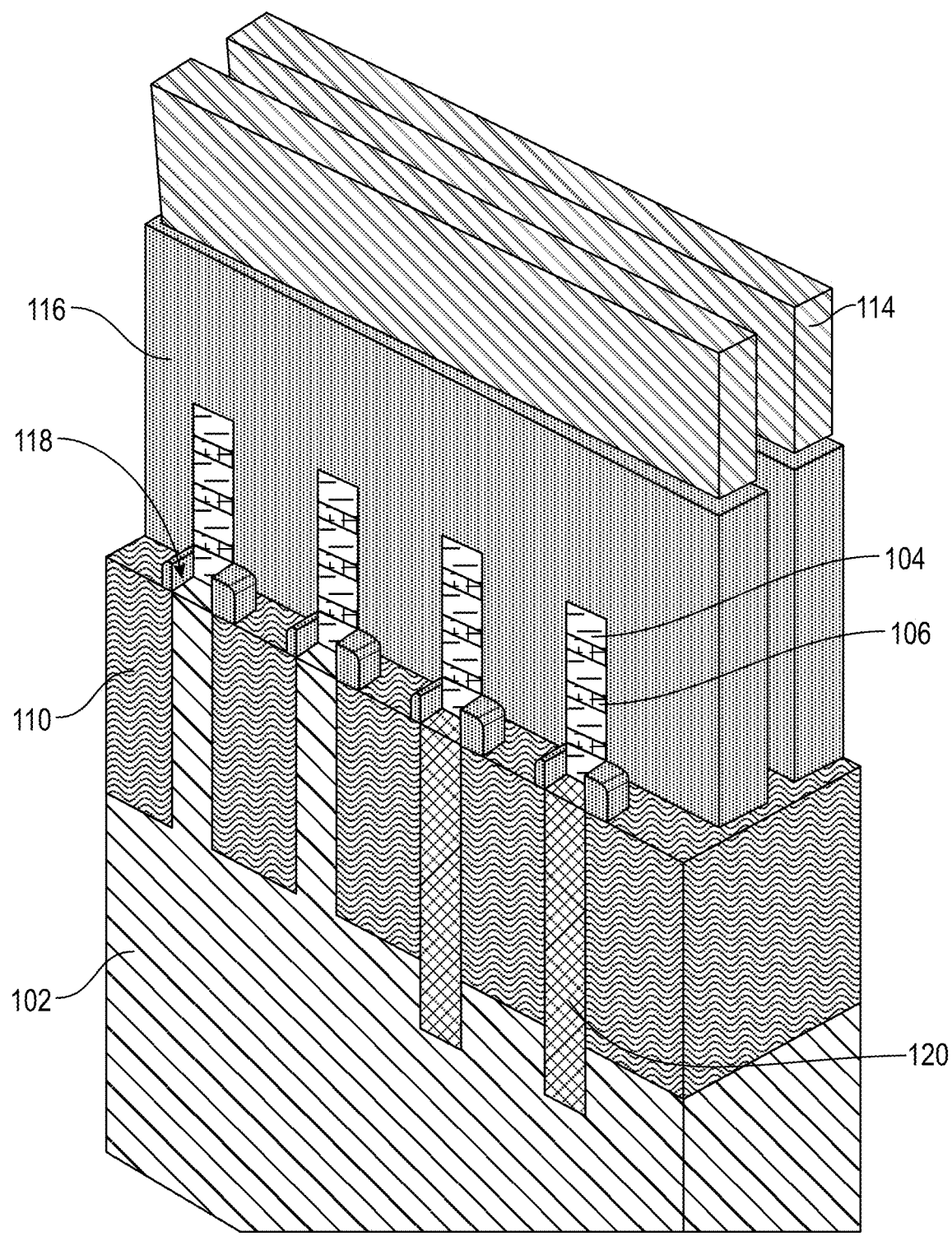
FIG. 2H illustrates a cross-section view of a device according to one or more embodiments.

Referring to FIG. 1A and FIG. 2H, at operation 28, a sacrificial material 120 is deposited in the cavity 119. The sacrificial material may comprise any suitable material known to the skilled artisan. In some embodiments, the sacrificial material 120 comprises silicon germanium (SiGe). In one or more embodiments, the sacrificial material 120 has a high germanium (Ge) content. In one or more embodiments, the amount of germanium is in a range of from 30% to 50%, including a range of from 35% to 45%. Without intending to be bound by theory, it is thought that the germanium content being in a range of from 30% to 50% leads to increased selectivity of the sacrificial material and minimizes stress defects.

In one or more embodiments, the sacrificial material 120 is doped with a dopant for lower contact resistance. In some embodiments, the dopant is selected from one or more of boron (B), gallium (Ga), phosphorus (P), arsenic (As), other semiconductor dopants, or combinations thereof. In specific embodiments, the sacrificial material 120 is silicon germanium having a germanium content in a range of from 30% to 50% and doped with a dopant selected from one or more of boron (B), gallium (Ga), phosphorus (P), and arsenic (As).

Figure 2I:
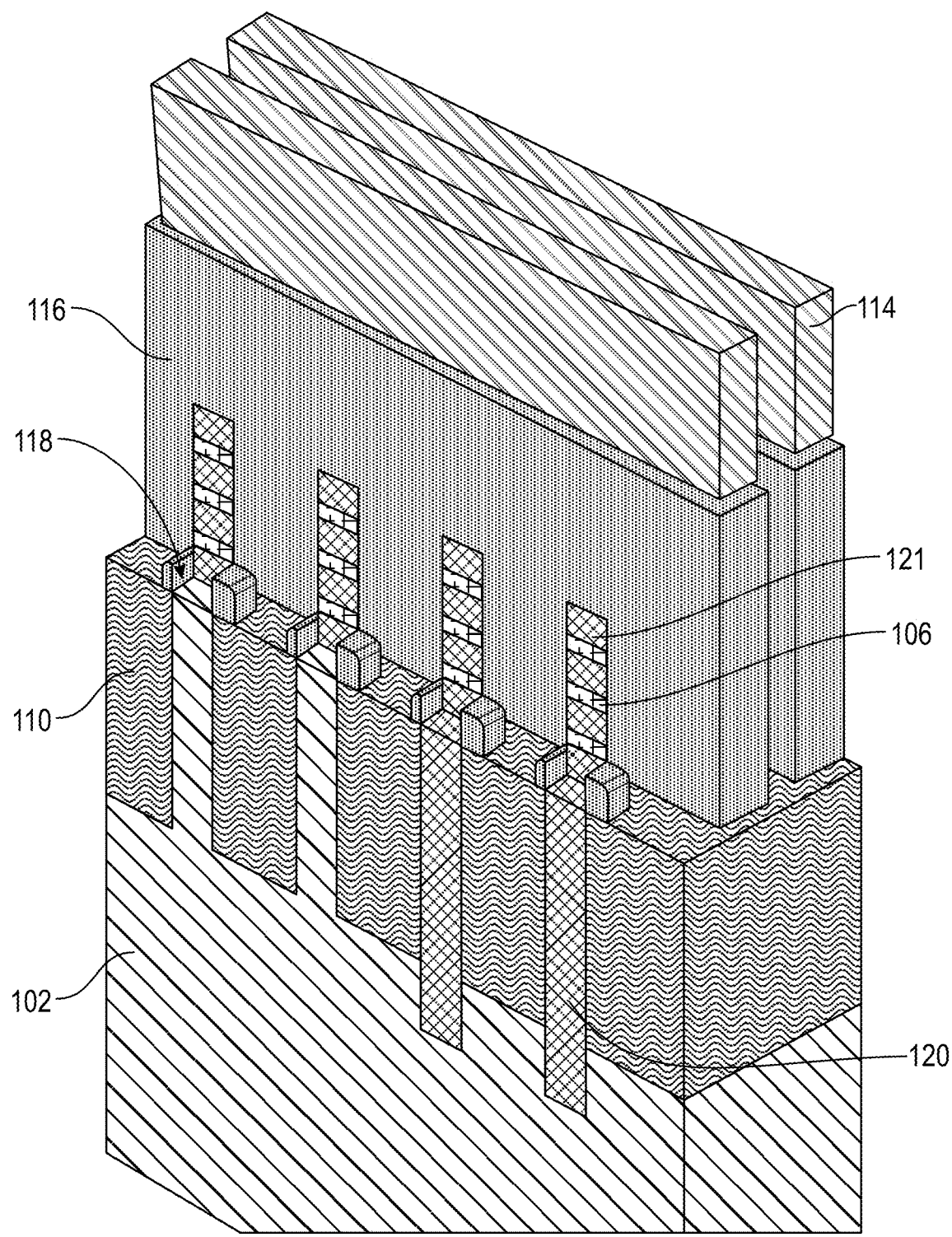
FIG. 2I illustrates a cross-section view of a device according to one or more embodiments.

Referring to FIG. 1A and FIG. 2I, at operation 30, an inner spacer layer 121 is formed on each of the horizontal channel layers 104. The inner spacer layer 121 may comprise any suitable material known to the skilled artisan. In one or more embodiments, the inner spacer layer 121 comprises a nitride material. In specific embodiments, the inner spacer layer 121 comprises silicon nitride.

Figure 2J:
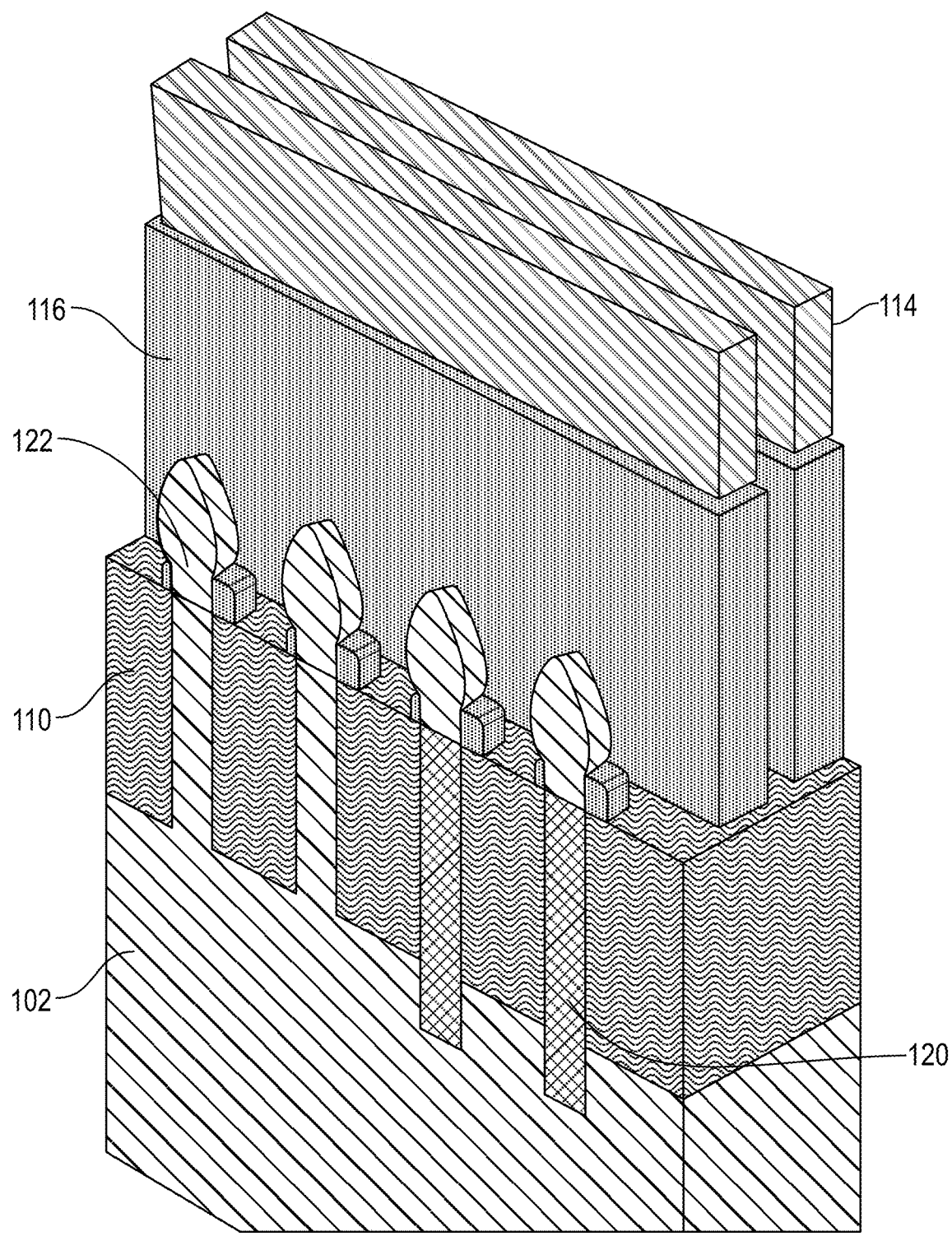
FIG. 2J illustrates a cross-section view of a device according to one or more embodiments.

With reference to FIG. 2J and to FIG. 1A, at operation 32, in some embodiments, the embedded source/drain regions 122 form in a source/drain trench 118. In some embodiments, the source region 122 is formed adjacent a first end of the superlattice structure 101 and the drain region 122 is formed adjacent a second, opposing end of the superlattice structure 101. In some embodiments, the source region and/or drain region 122 are formed from any suitable semiconductor material, such as but not limited to silicon (Si), germanium (Ge), silicon germanium (SiGe), silicon phosphorous (SiP), silicon arsenic (SiAs), or the like. In some embodiments, the source/drain regions 122 may be formed using any suitable deposition process, such as an epitaxial deposition process. In some embodiments, the source/drain regions 122 are independently doped with one or more of phosphorus (P), arsenic (As), boron (B), and gallium (Ga).

Figure 2K:
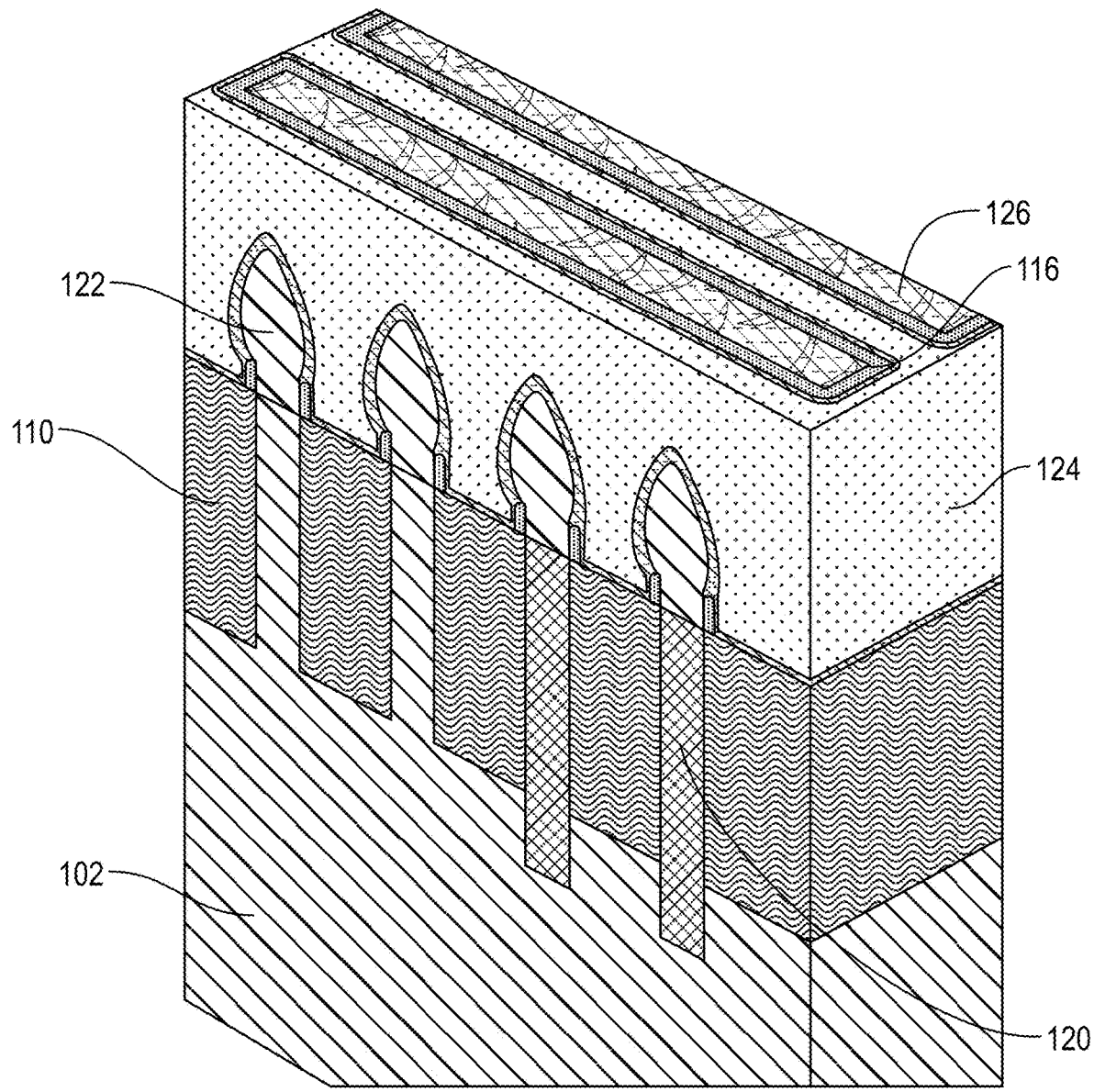
FIG. 2K illustrates a cross-section view of a device according to one or more embodiments.

In some embodiments, with reference to FIG. 1A and FIG. 2K, at operation 34, an inter-layer dielectric (ILD) layer 124 is blanket deposited over the substrate 102, including the source/drain regions 122, the dummy gate structure 113, and the sidewall spacers 116. The ILD layer 124 may be deposited using a conventional chemical vapor deposition method (e.g., plasma enhance chemical vapor deposition and low-pressure chemical vapor deposition). In one or more embodiments, ILD layer 124 is formed from any suitable dielectric material such as, but not limited to, undoped silicon oxide, doped silicon oxide (e.g., BPSG, PSG), silicon nitride, and silicon oxynitride. In one or more embodiments, ILD layer 124 is then polished back using a conventional chemical mechanical planarization method to expose the top of the dummy gate structure 113. In some embodiments, the ILD layer 124 is polished to expose the top of the dummy gate structure 113 and the top of the sidewall spacers 116.

The dummy gate structure 113 may be removed to expose the channel region 108 of the superlattice structure 101. The ILD layer 124 protects the source/drain regions 122 during the removal of the dummy gate structure 113. The dummy gate structure 113 may be removed using any conventional etching method such as a plasma dry etch or a wet etch. In some embodiments, the dummy gate structure 113 comprises poly-silicon and the dummy gate structure 113 is removed by a selective etch process. In some embodiments, the dummy gate structure 113 comprises poly-silicon and the superlattice structure 101 comprises alternating layers of silicon (Si) and silicon germanium (SiGe).

Figure 2L:
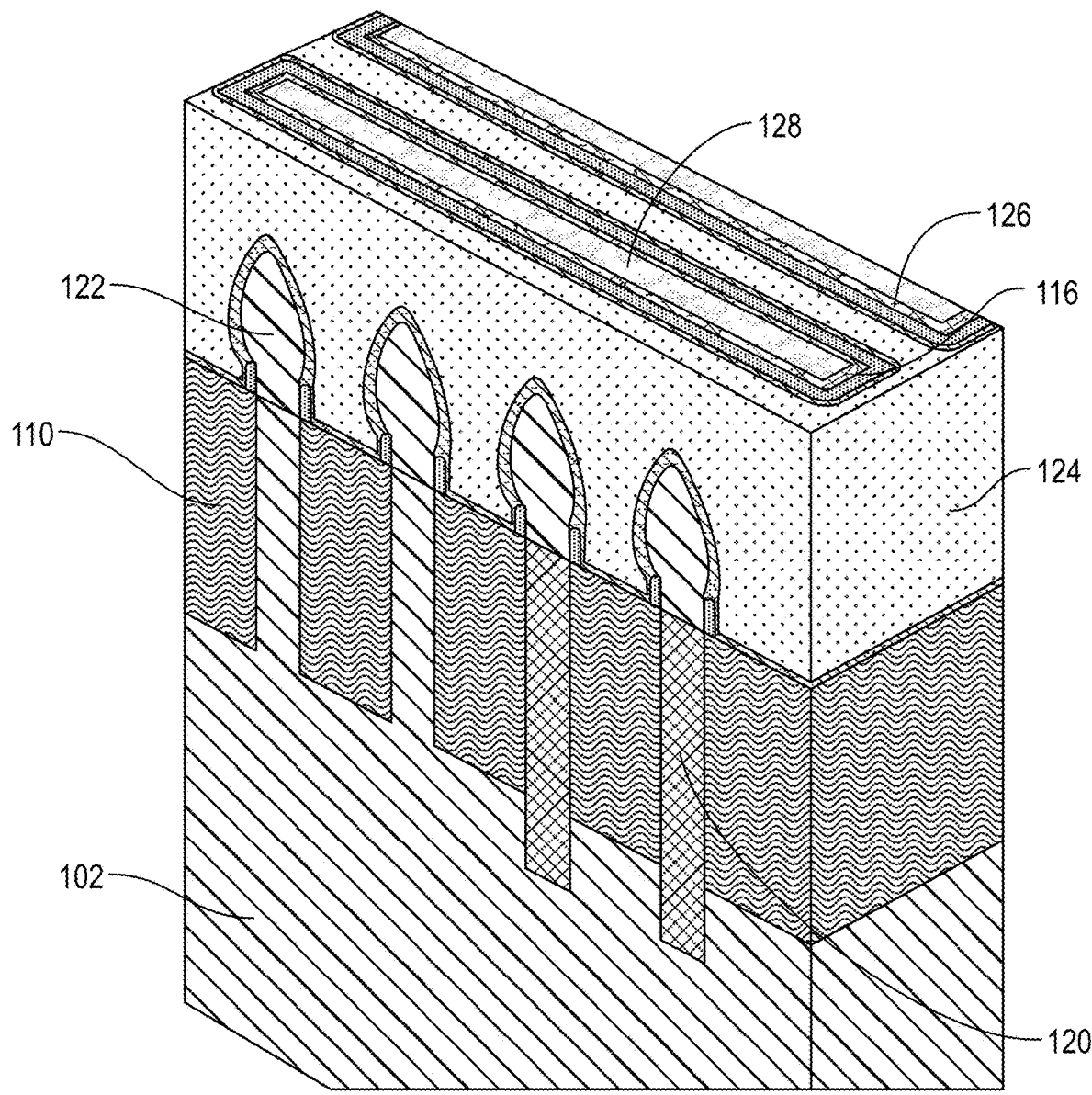
FIG. 2L illustrates a cross-section view of a device according to one or more embodiments.

Referring to FIG. 1B and FIG. 2L, at operations 38, the formation of the semiconductor device, e.g., GAA, continues according to traditional procedures with nanosheet release and replacement metal gate formation. Specifically, in one or more unillustrated embodiments, the plurality of semiconductor material layers 106 are selectively etched between the plurality of horizontal channel layers 104 in the superlattice structure 101. For example, where the superlattice structure 101 is composed of silicon (Si) layers and silicon germanium (SiGe) layers, the silicon germanium (SiGe) is selectively etched to form channel nanowires. The plurality of semiconductor material layers 106, for example silicon germanium (SiGe), may be removed using any well-known etchant that is selective to the plurality of horizontal channel layers 104 where the etchant etches the plurality of semiconductor material layers 106 at a significantly higher rate than the plurality of horizontal channel layers 104. In some embodiments, a selective dry etch or wet etch process may be used. In some embodiments, where the plurality of horizontal channel layers 104 are silicon (Si) and the plurality of semiconductor material layers 106 are silicon germanium (SiGe), the layers of silicon germanium (SiGe) may be selectively removed using a wet etchant such as, but not limited to aqueous carboxylic acid/nitric acid/HF solution and aqueous citric acid/nitric acid/HF solution. The removal of the plurality of semiconductor material layers 106 leaves voids between the plurality of horizontal channel layers 104. The voids between the plurality of horizontal channel layers 104 have a thickness of about 3 nm to about 20 nm. The remaining horizontal channel layers 104 form a vertical array of channel nanowires that are coupled to the source/drain regions 122. The channel nanowires run parallel to the top surface of the substrate 102 and are aligned with each other to form a single column of channel nanowires.

In one or more embodiments, a high-k dielectric is formed. The high-k dielectric can be any suitable high-k dielectric material deposited by any suitable deposition technique known to the skilled artisan. The high-k dielectric of some embodiments comprises hafnium oxide. In some embodiments, a conductive material such as titanium nitride (TiN), tungsten (W), cobalt (Co), aluminum (Al), or the like is deposited on the high-k dielectric to form the replacement metal gate 128. The conductive material may be formed using any suitable deposition process such as, but not limited to, atomic layer deposition (ALD) in order to ensure the formation of a layer having a uniform thickness around each of the plurality of channel layers.

Figure 2M:
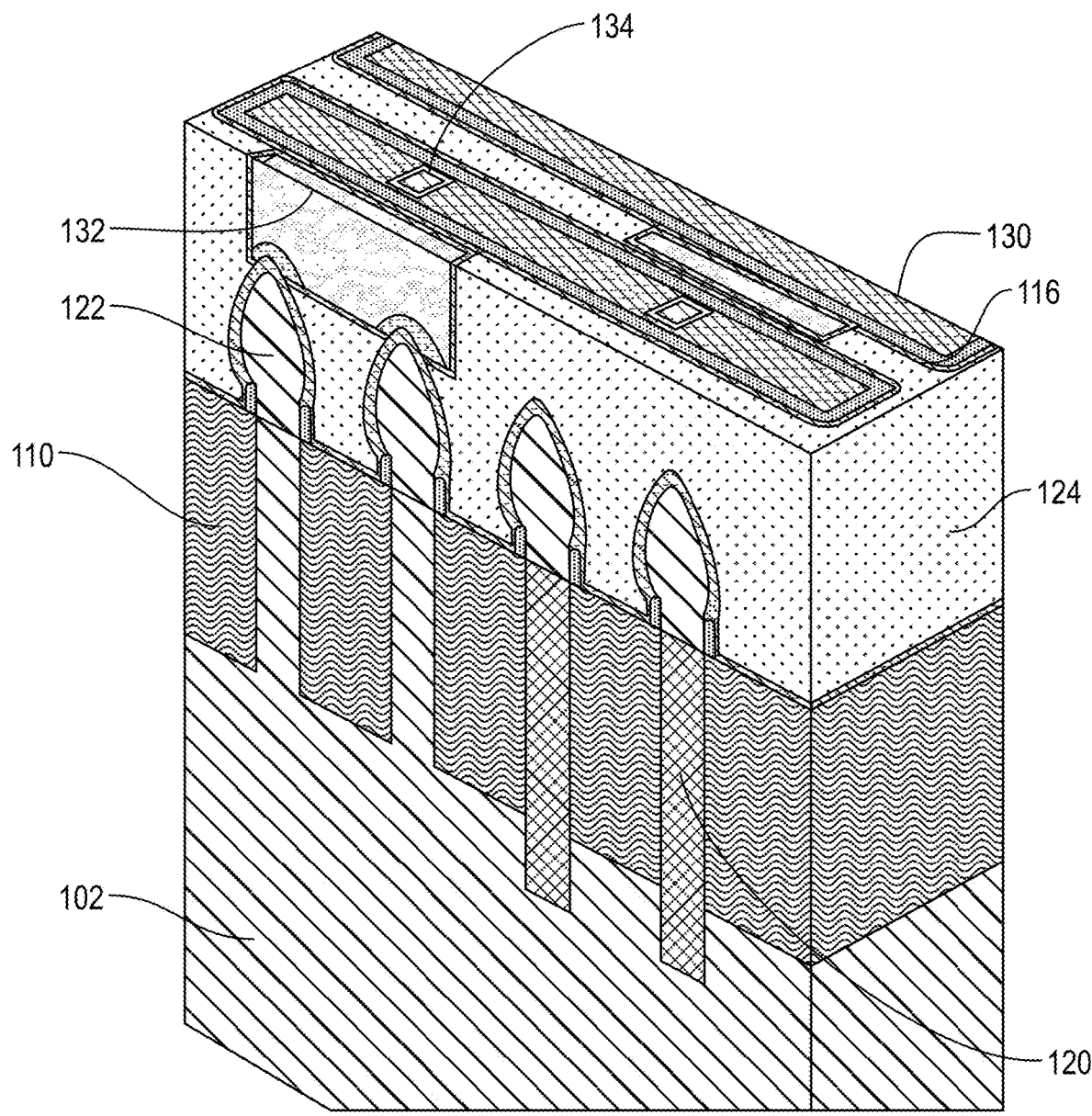
FIG. 2M illustrates a cross-section view of a device according to one or more embodiments.

Referring to FIG. 1B and FIG. 2M, at operation 38, the contact to transistor (CT) 132 and contact to gate (CG) 134 are formed.

Figure 2N:
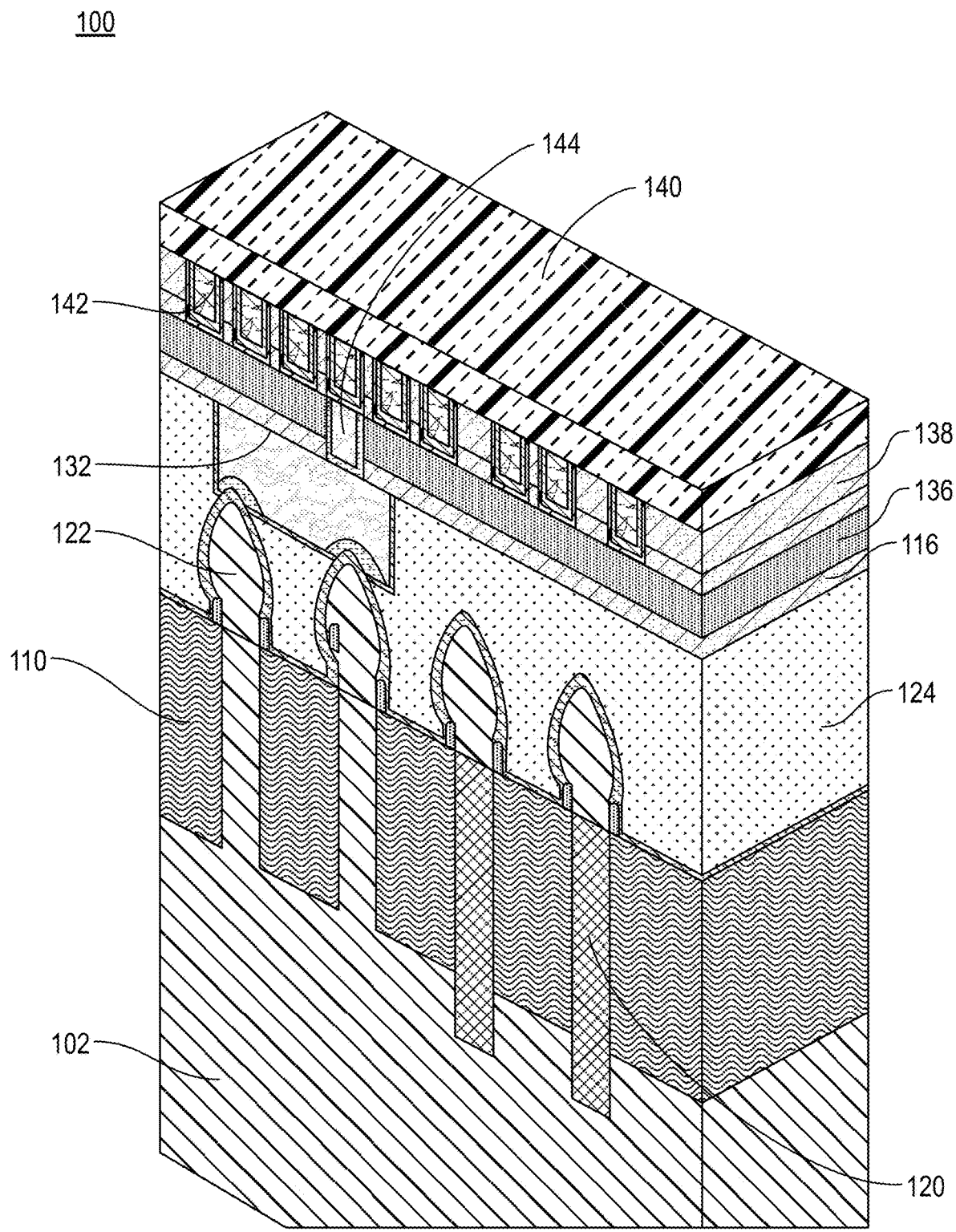
FIG. 2N illustrates a cross-section view of a device according to one or more embodiments.

With reference to FIG. 1B and FIG. 2N, at operation 40, the metal (M0) line 142 is formed and electrically connected to the via (V1) 144. This is similar to traditional processing, only M0 lines do not have power rails, thus creating ample space for signal lines.

Figure 2O:
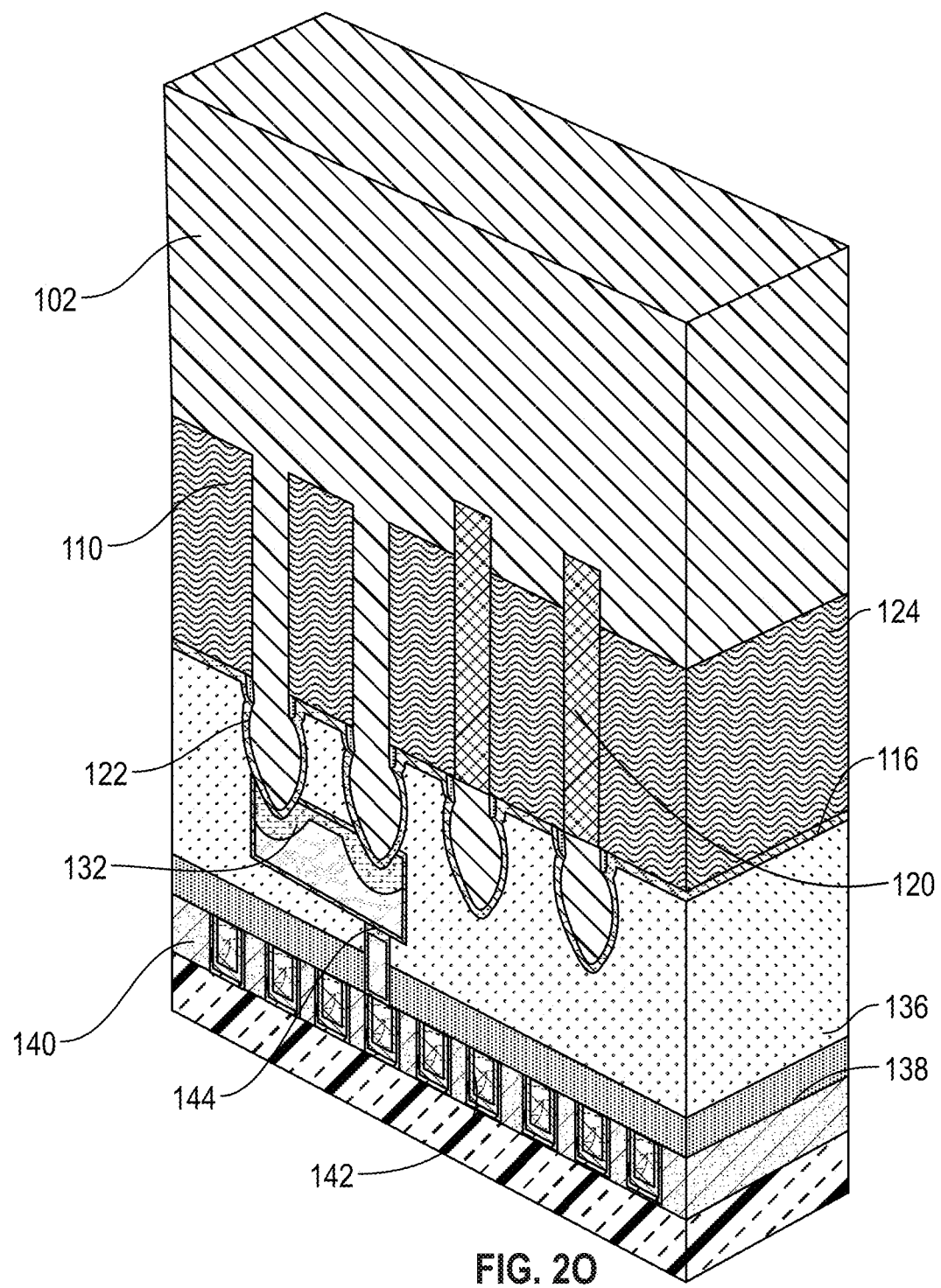
FIG. 2O illustrates a cross-section view of a device according to one or more embodiments.

With reference to FIG. 2O, at operation 42, the device 100 is rotated or flipped 180 degrees, such that the substrate 102 is now at the top of the illustration. Additionally, in one or more embodiments, the substrate 102 is planarized. The planarization may be any suitable planarization process known to the skill artisan including, but not limited to, chemical mechanical planarization (CMP). In one or more embodiments, before rotating, the front side is bonded to copper (Cu) metallization at last layer, with hybrid bonding (oxide to oxide and Cu to Cu), or electrostatic dummy wafer bonding.

Figure 2P:
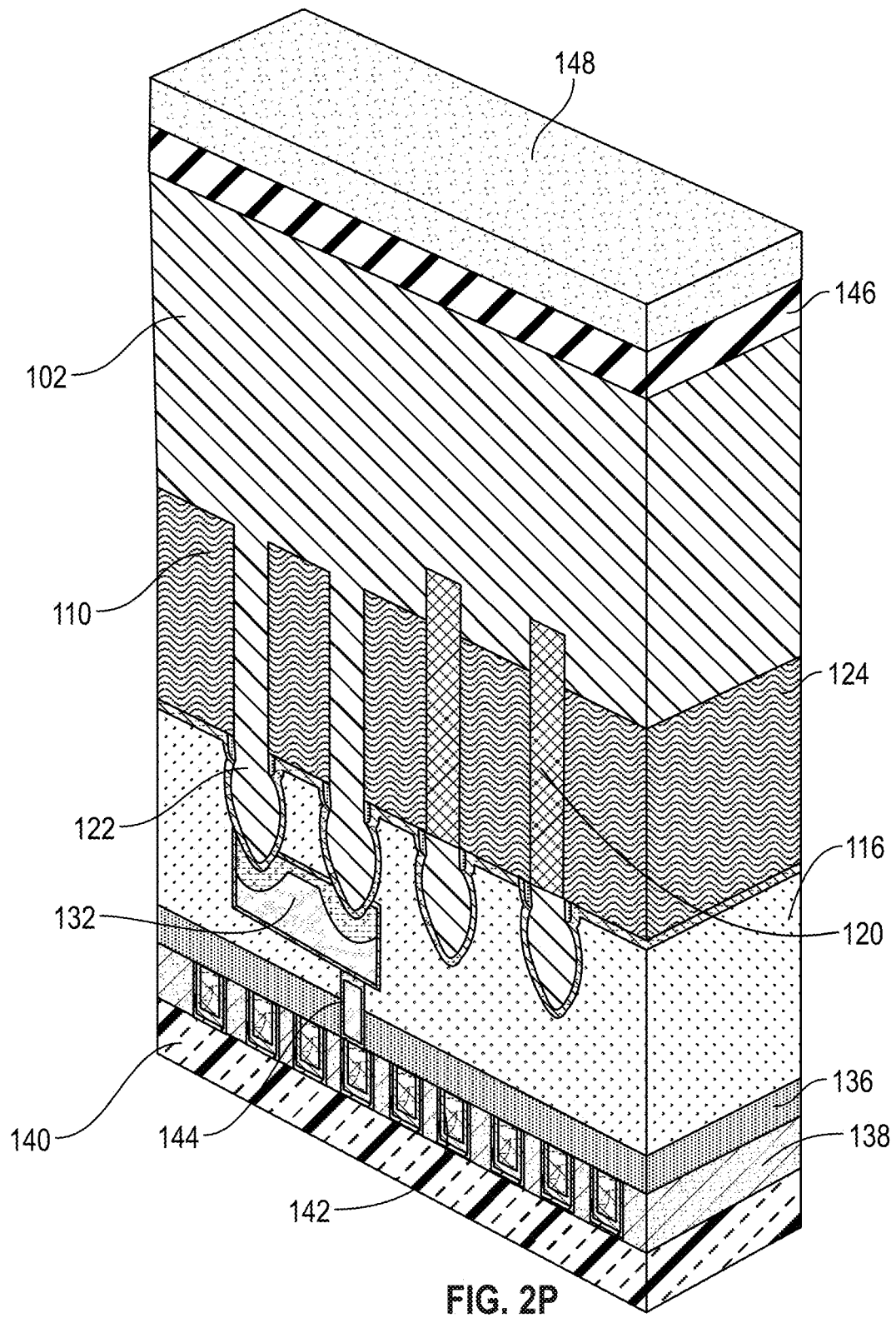
FIG. 2P illustrates a cross-section view of a device according to one or more embodiments.

With reference to FIG. 1B and FIG. 2P, at operation 44, an interlayer dielectric 146/148 is deposited on the backside. The interlayer dielectric materials 146/148 may be deposited by any suitable means known to one of skill in the art. The interlayer dielectric materials 146/148 may comprise any suitable materials known to the skilled artisan. In one or more embodiments, the interlayer dielectric materials 146/148 comprise one or more of silicon nitride (SiN), carbide, or boron carbide, to allow high aspect ratio etch and metallization.

Figure 2Q:
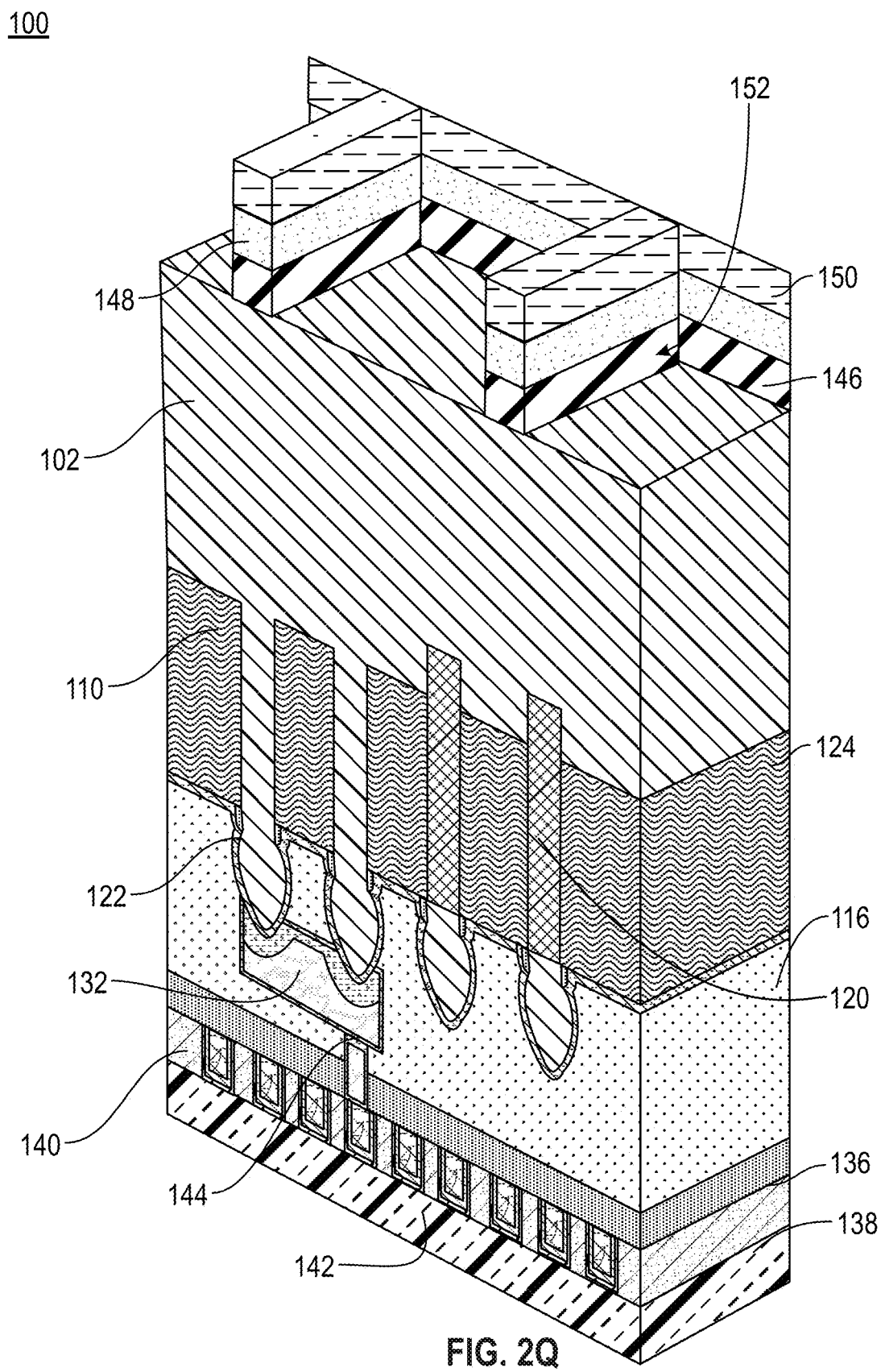
FIG. 2Q illustrates a cross-section view of a device according to one or more embodiments.

As illustrated in FIG. 2Q, at operation 46, in one or more embodiments, a backside power rail via 152 is formed. The via 152 may be formed by any suitable means known to the skilled artisan. In one or more embodiments, the via 152 may be formed by patterning and etching the interlayer dielectric materials 146/148.

Figure 2R:
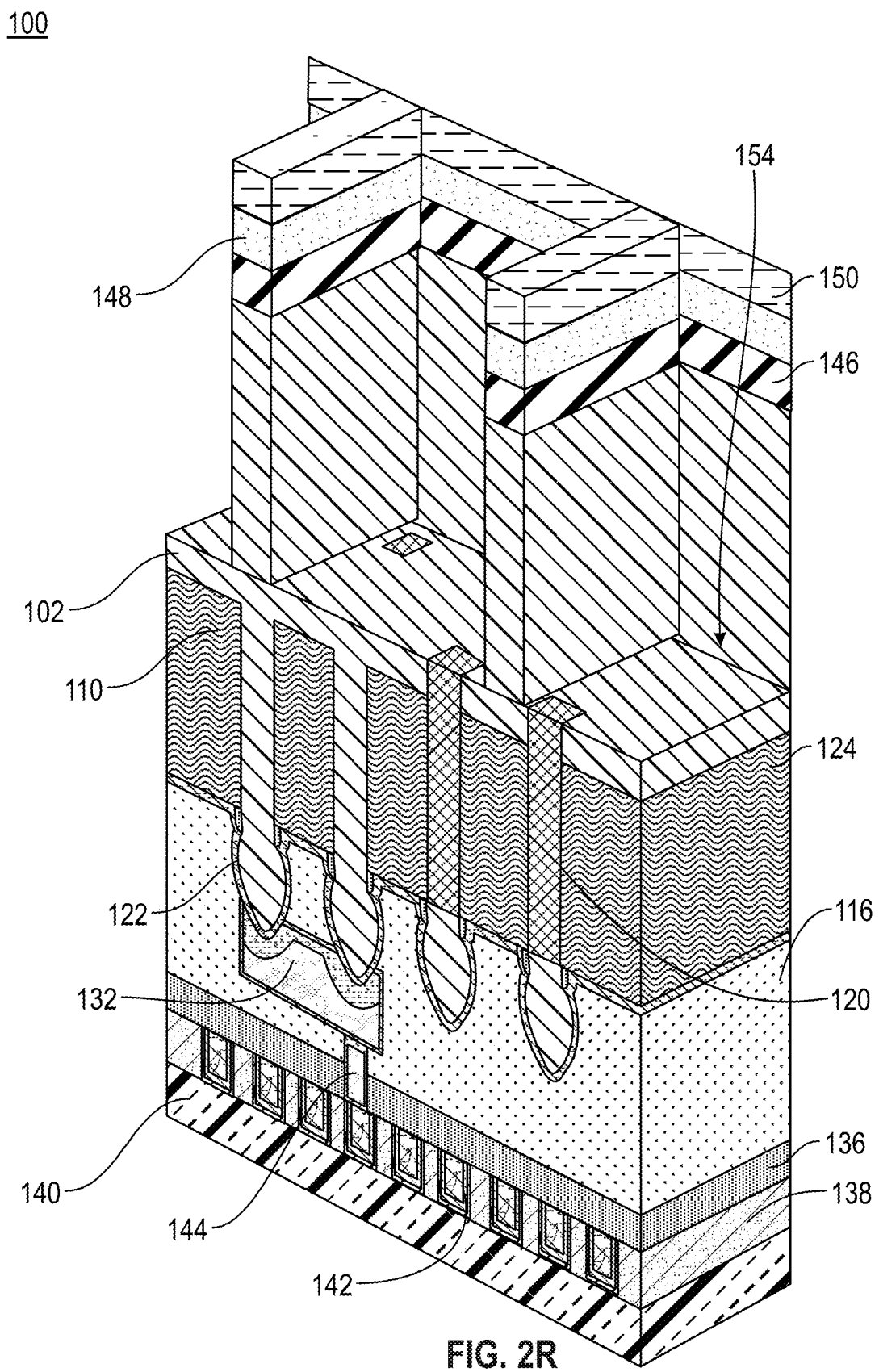
FIG. 2R illustrates a cross-section view of a device according to one or more embodiments.

Referring to FIG. 1B and FIG. 2R, at operation 48, a damascene trench 154 is formed by expanding the via 152 to the contacts 120, 122. Expansion of the via 152 to form trench 154 increase the size of the open by at least double, permitting self-alignment. In one or more embodiments, the via 152 has a starting size of about 16 nm by about 26 nm and is expanded to form trench 154 having a size of about 90 nm by about 74 nm.

The damascene trench 154 stops at the contacts 120, 122. The damascene trench 154 may have any suitable aspect ratio known the skilled artisan. In some embodiments, the aspect ratio is greater than or equal to about 5:1, about 10:1, about 15:1, about 20:1, about 25:1, about 30:1, about 35:1 or about 40:1. In one or more embodiments, the critical dimensions of the damascene trench 154 are about 16 nm by about 26 nm, or about 10 nm by about 30 nm, or about 15 nm by about 30 nm. In one or more embodiments, the height of the back side vias depends on the original epitaxial layer thickness deposited over the etch stop layer.

Figure 2S:
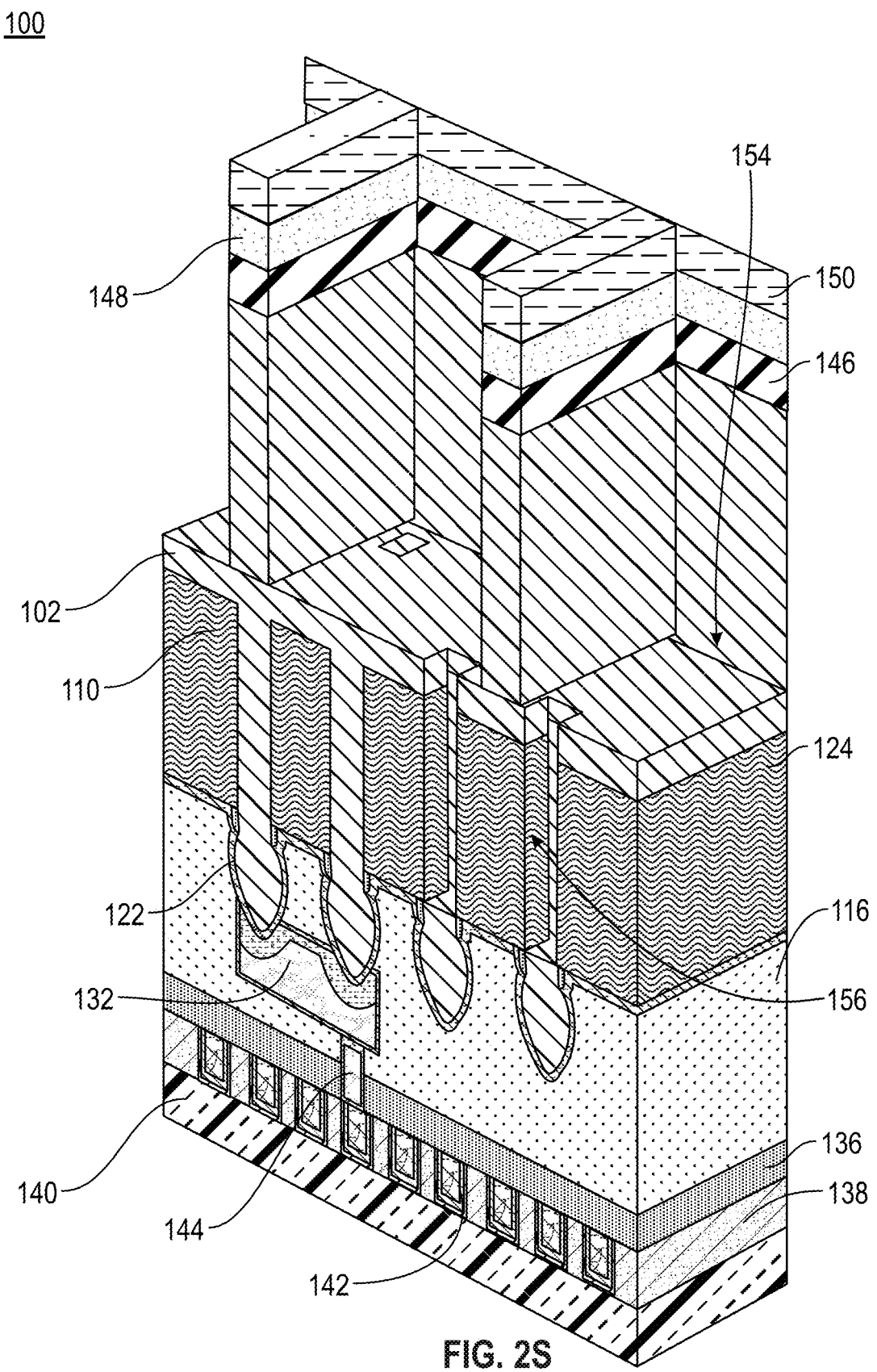
FIG. 2S illustrates a cross-section view of a device according to one or more embodiments.

At operation 50, as illustrated in FIG. 2S, the sacrificial layer 120 is selectively removed to form an opening 156 over the source/drain 122. In one or more embodiments, if the sacrificial layer 120 is doped with one or more of Ga, B, P, it may be removed partially leaving some of the sacrificial layer 120 remained. Partial remove of the sacrificial layer 120 allows the formation of a low resistivity contact to the remaining sacrificial layer 120 (e.g., SiGe).

Figure 2T:
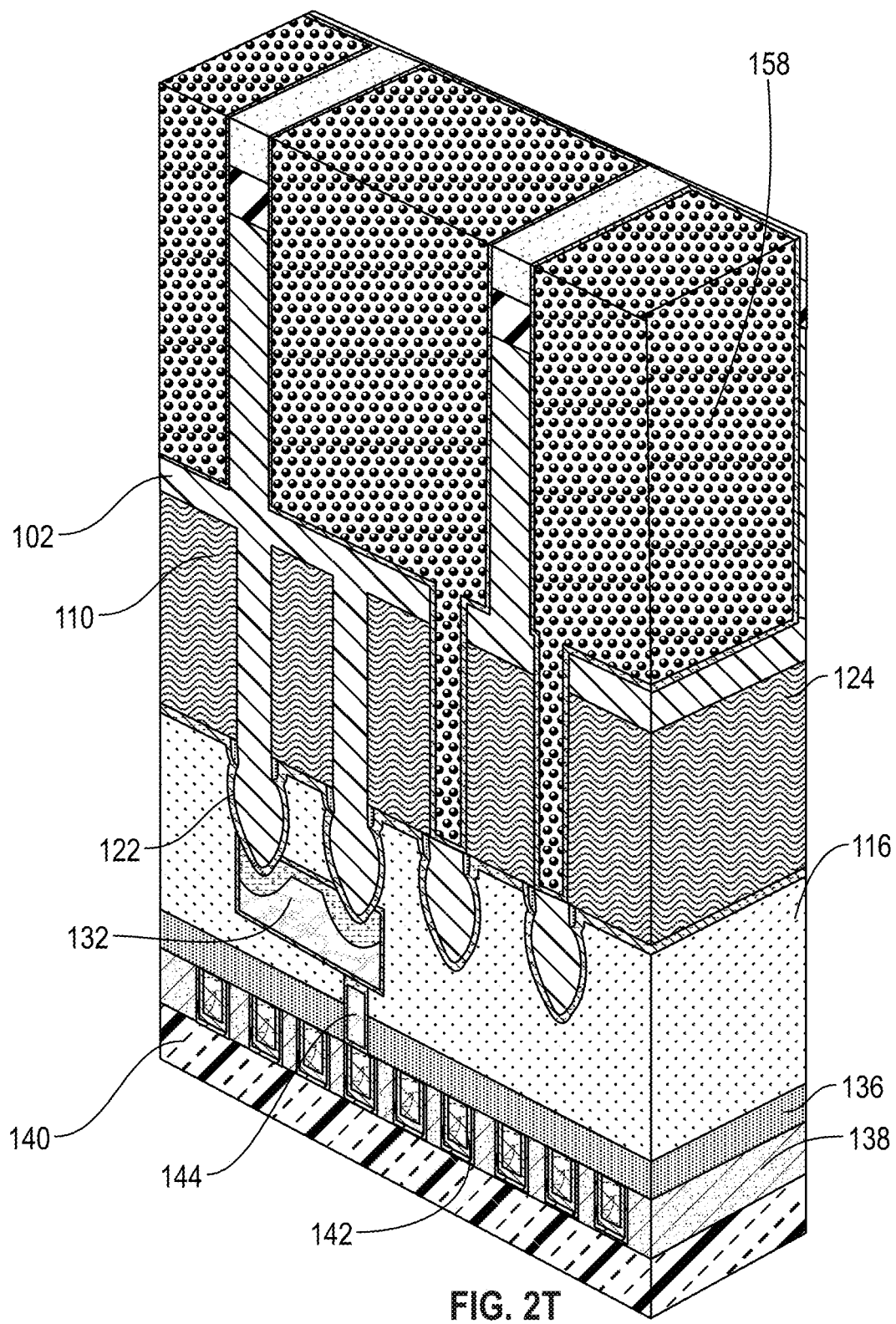
FIG. 2T illustrates a cross-section view of a device according to one or more embodiments.
Figure 2U:
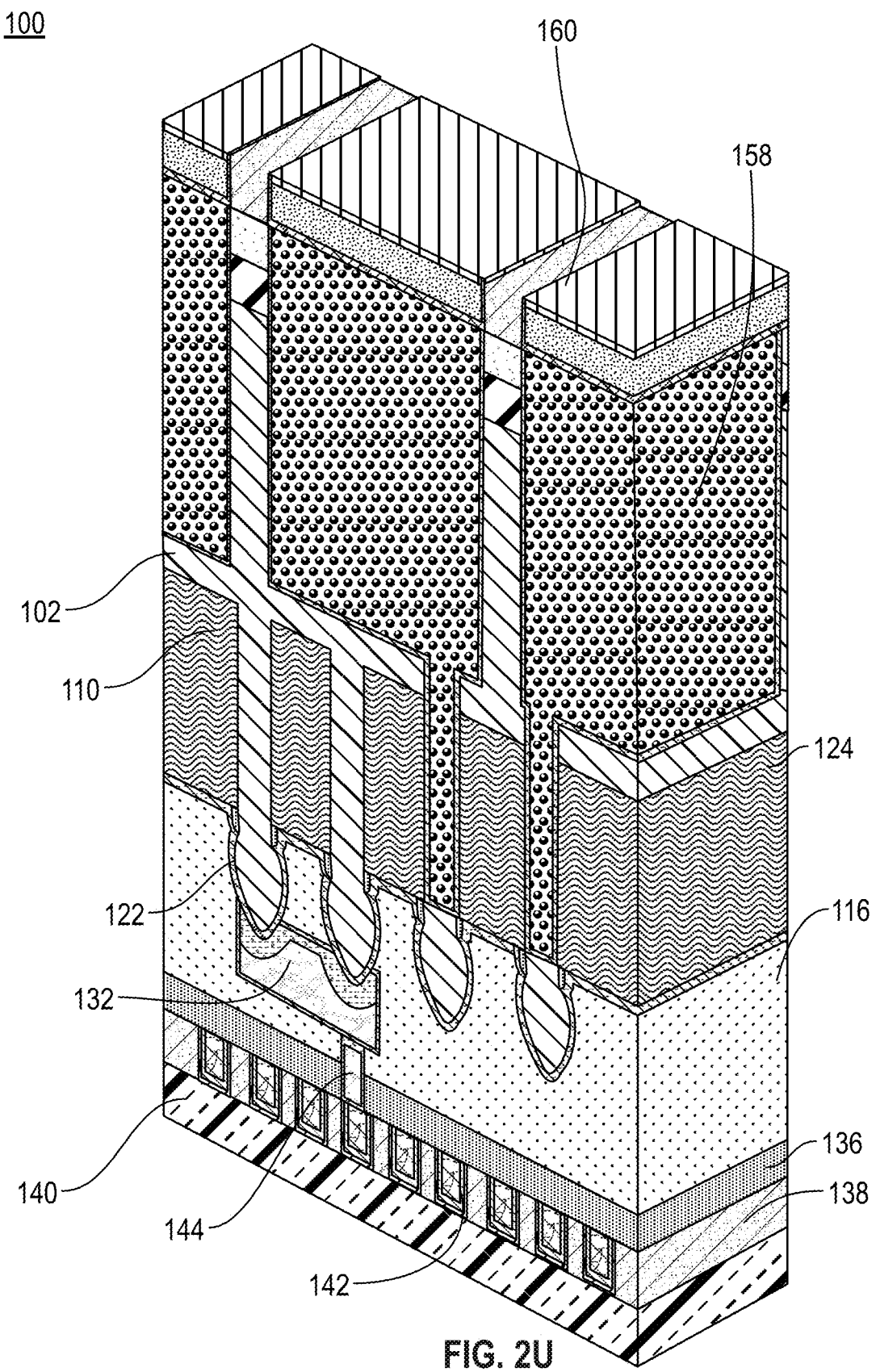
FIG. 2U illustrates a cross-section view of a device according to one or more embodiments.

At operation 52, as illustrated in FIG. 2T, a metal fill 158 is deposited in the opening 156 formed by removal of the sacrificial layer 120. The metal fill 158 may comprise any suitable material known to the skilled artisan. In one or more embodiments, the metal fill 158 is selected from one or more of titanium (Ti), titanium nitride (TiN), tantalum (Ta), tantalum nitride (TaN), tungsten (W), molybdenum (Mo), cobalt (Co), copper (Cu), ruthenium (Ru), and the like.

With reference to FIG. 1B and FIG. 2U, at operation 54, the backside metal line (M0) 160 is formed. Without intending to be bound by theory, it is thought that locating the power rail on the backside allows for a gain in the area of the cell in a range of from 20% to 30%.

Figure 3:
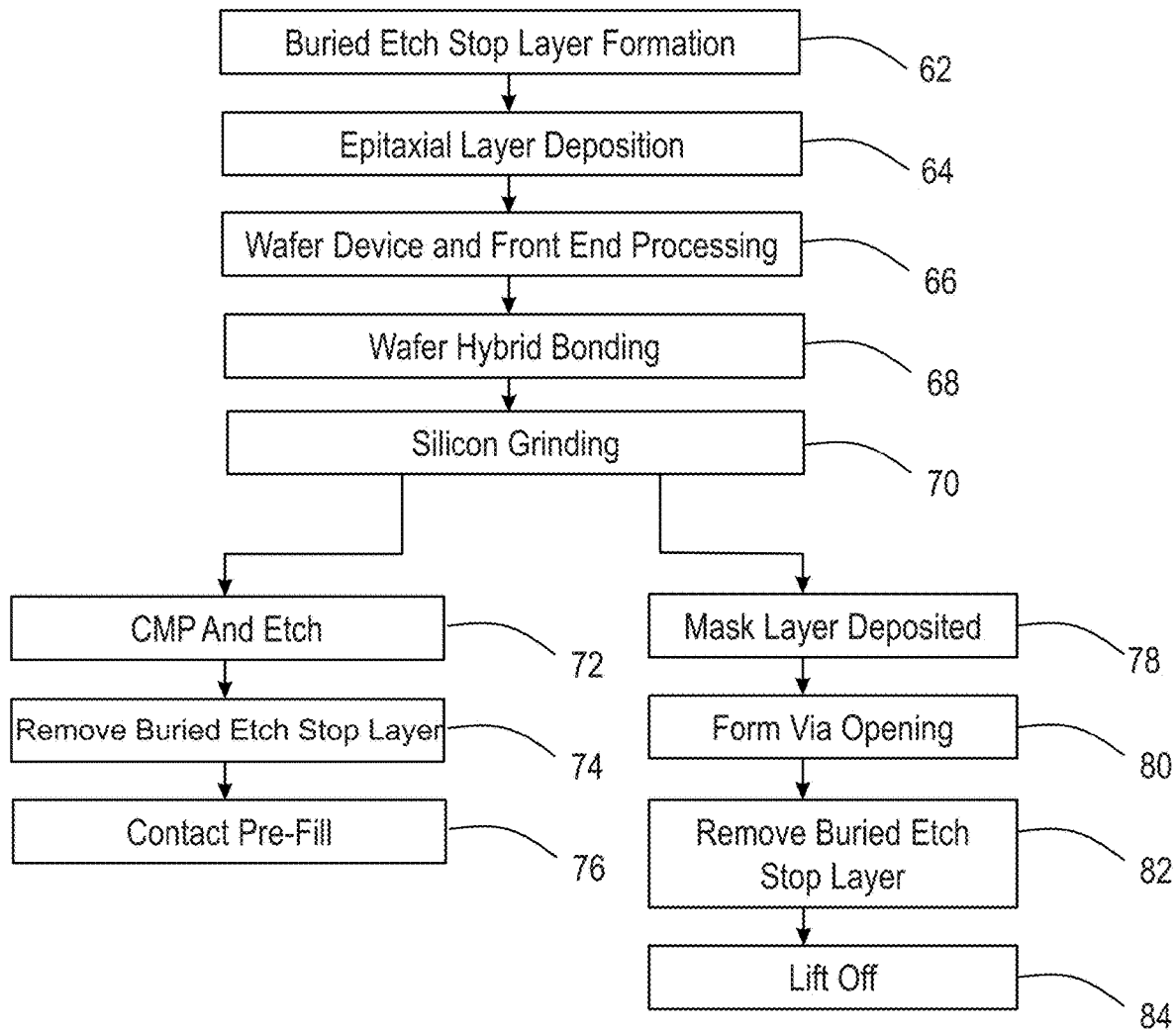
FIG. 3 illustrates a process flow diagram of a method according to one or more embodiments.

FIG. 3 illustrates a process flow diagram for a method 60 for thinning a semiconductor wafer in accordance with some embodiments of the present disclosure. FIGS. 4A-4E depict the stages of wafer thinning in accordance with some embodiments of the present disclosure. The method 60 is described below with respect to FIGS. 4A-4E. FIGS. 4A-4E are cross-sectional views of an electronic device (e.g., a GAA) according to one or more embodiments. The method 60 may be part of a multi-step fabrication process of a semiconductor device. Accordingly, the method 60 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

FIGS. 4A-4E are the fabrication steps of operations 62 through 76 in FIG. 3. Referring to FIG. 3, the method 60 of thinning the wafer 400 begins at operation 62. Referring to FIG. 3 and FIGS. 4A-4E, in the method of one or more embodiments, transistors, e.g., gate-all-around transistors, are fabricated using a standard process flow.

In some embodiments, a silicon wafer 402 is provided and, at operation 62, a buried etch stop layer 404 is formed on the silicon wafer 402. The buried etch stop layer 404 may comprise any suitable material known to the skilled artisan. In one or more embodiments, the buried etch stop layer 404 comprises silicon germanium (SiGe). In one or more embodiments, the buried etch stop layer 404 has a high germanium (Ge) content. In one or more embodiments, the amount of germanium is in a range of from 30% to 50%, including a range of from 35% to 45%. Without intending to be bound by theory, it is thought that the germanium content being in a range of from 30% to 50% leads to increased selectivity of the buried etch stop layer 404 and minimizes stress defects.

In one or more unillustrated embodiments, at operation 64, an epitaxial layer, e.g., epitaxial silicon, is deposited. At operation 66, the wafer is then subjected to device and front-end processing. Front-end processing may be the processes described above with respect to method 6 illustrated in FIGS. 1A-1B and as depicted in cross-sectional views FIGS. 2A-2U.

Figure 4A:
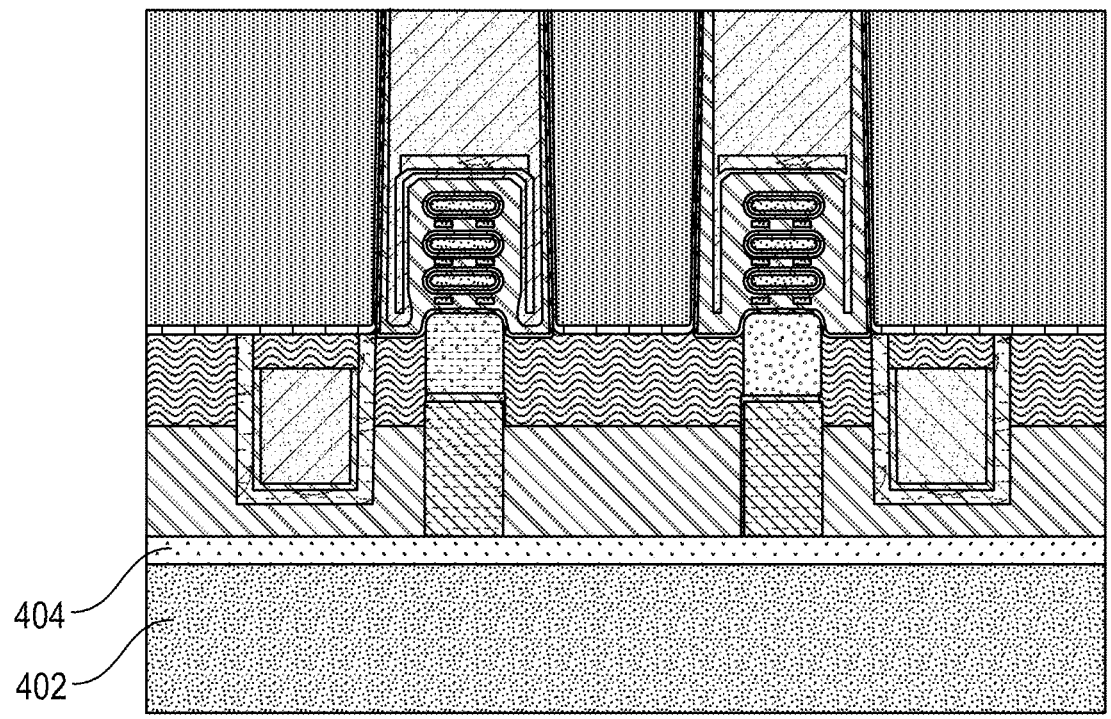
FIG. 4A illustrates a cross-section view of a device according to one or more embodiments.
Figure 4B:
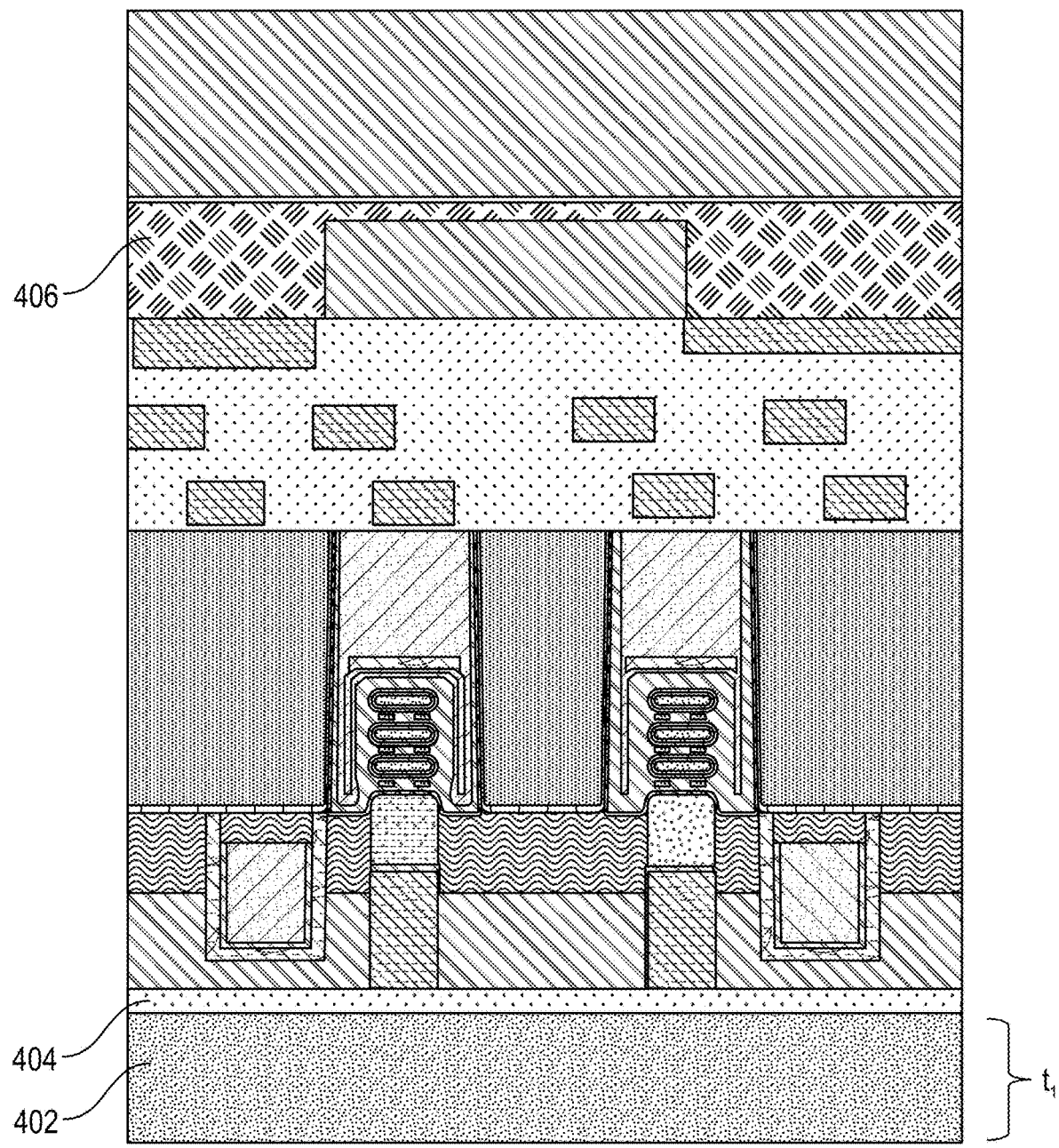
FIG. 4B illustrates a cross-section view of a device according to one or more embodiments.

Referring to FIG. 3 and FIG. 4B, at operation 68, in one or more embodiments, after front-end processing, the wafer 400 undergoes hybrid bonding to a bonding wafer 406, e.g., to copper or to an oxide, and then the wafer 400 is advantageously thinned. Without intending to be bound by theory, it is thought that thinning the wafer advantageously provides the desired flatness and bonding for making a backside power rail possible.

Figure 4C:
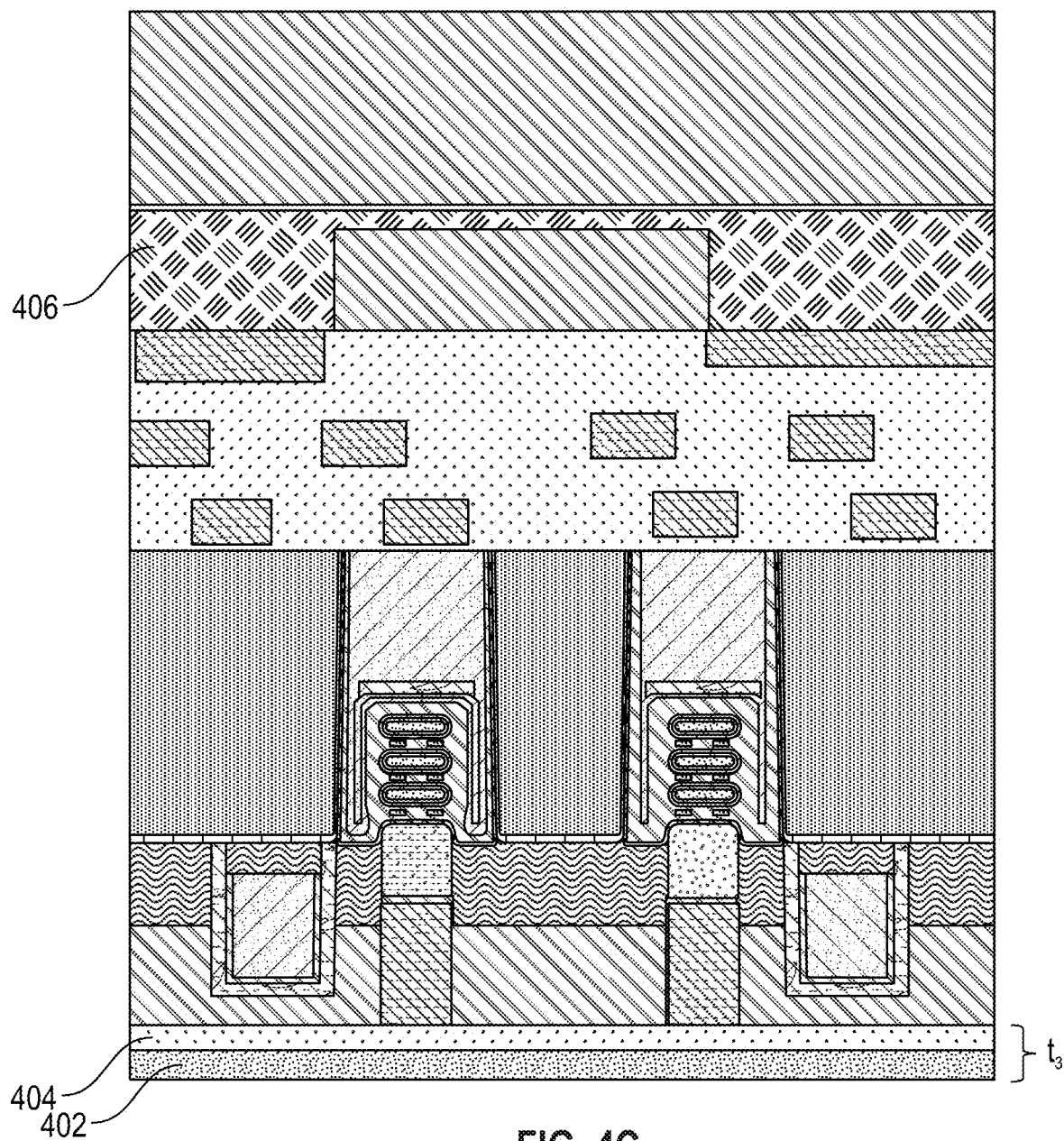
FIG. 4C illustrates a cross-section view of a device according to one or more embodiments.

In one or more embodiments, referring to FIG. 3, and FIG. 4C, to thin the wafer 400, at operation 70, the silicon substrate layer 402, which has a starting first thickness, $t_1$, is ground to a second thickness, the second thickness, $t_2$, less than the first thickness. The silicon substrate layer 402 may be ground by any suitable means known to the skilled artisan. In some embodiments, the silicon substrate layer 402 is subjected to chemical mechanical planarization (CMP), followed by etching and CMP buffing, to reduce the thickness of the silicon substrate layer 402 to a third thickness, $t_3$, the third thickness less than the second thickness. In one or more embodiments, the first thickness is in a range of from 500 μm to 1000 μm. In one or more embodiments, the second thickness is in a range of from 20 μm to 100 μm. In one or more embodiments, the third thickness is in a range of from 1 μm to 20 μm.

Figure 4D:
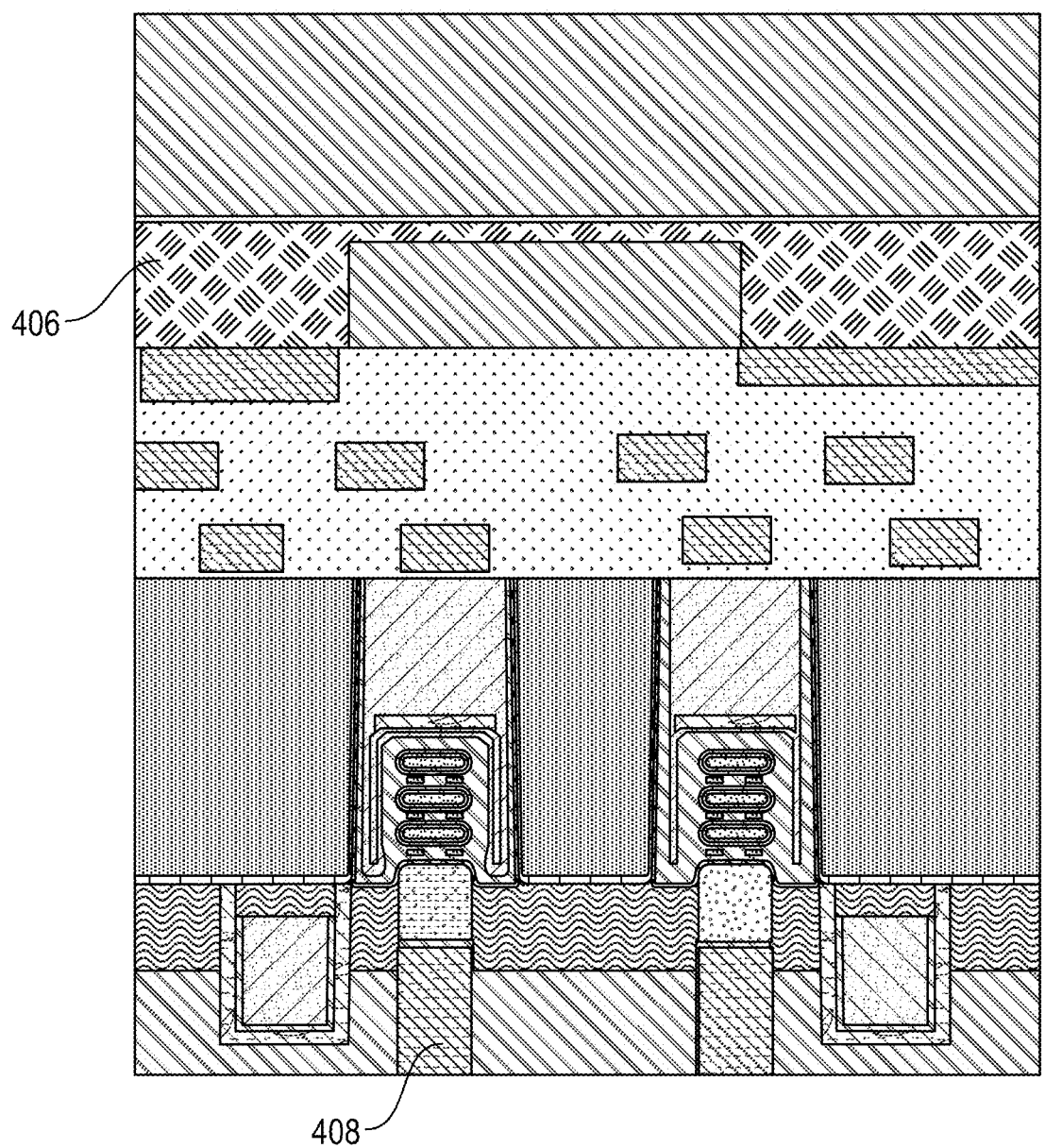
FIG. 4D illustrates a cross-section view of a device according to one or more embodiments.
Figure 4E:
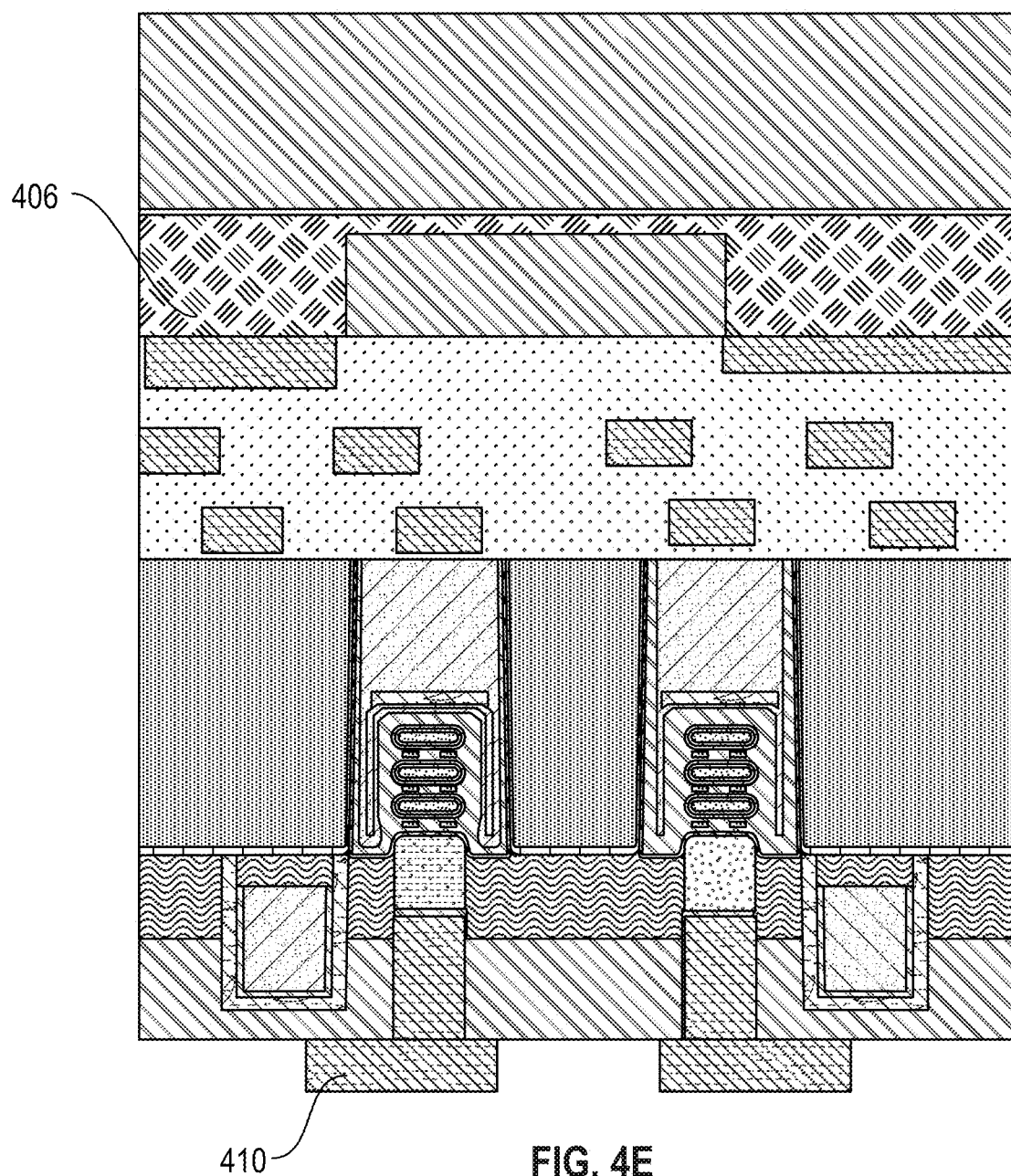
FIG. 4E illustrates a cross-section view of a device according to one or more embodiments.

Referring to FIG. 3 and FIG. 4D, at operations 72-74, the buried etch stop layer 404 is selectively removed to expose the source/drain 408. At operation 76, contacts 410 are then prefilled with a metal, and metallization is conducted, as illustrated in FIG. 4E. In one or more embodiments, the contact 410 is prefilled with a metal is selected from one or more of titanium (Ti), titanium nitride (TiN), tantalum (Ta), tantalum nitride (TaN), tungsten (W), molybdenum (Mo), cobalt (Co), copper (Cu), ruthenium (Ru), and the like.

FIGS. 5A-5E illustrate the alternative fabrication steps of operations 78-80 in FIG. 3. Referring to FIG. 3, the method 60 of thinning the device 400 begins at operation 62 and proceeds to operation 70, as detailed and illustrated in FIGS. 4A-4C.

After the silicon substrate 402 has been thinned by silicon grinding at operation 70, the method may proceed to operation 78 where a large mask 502 is formed on the buried etch stop layer 404. The mask 502 may comprise any suitable material known to the skilled artisan. In one or more embodiments, the mask 502 is selected from one or more of carbide, boron carbide, and silicon nitride.

At operation 80, the mask 502 is etched to form a plurality of thru silicon vias (TSV) 508, which extend to the buried etch stop layer 404. The vias 508 may be formed by any suitable means known to the skilled artisan. In one or more embodiments, the vias 508 are formed by etching. The TSVs, which are nano meter size, allow high density packaging of this formed device or other chips which are connected to this device, without need for traditional large TSVs, which add cost and space in regular 3D packaging.

Figure 5A:
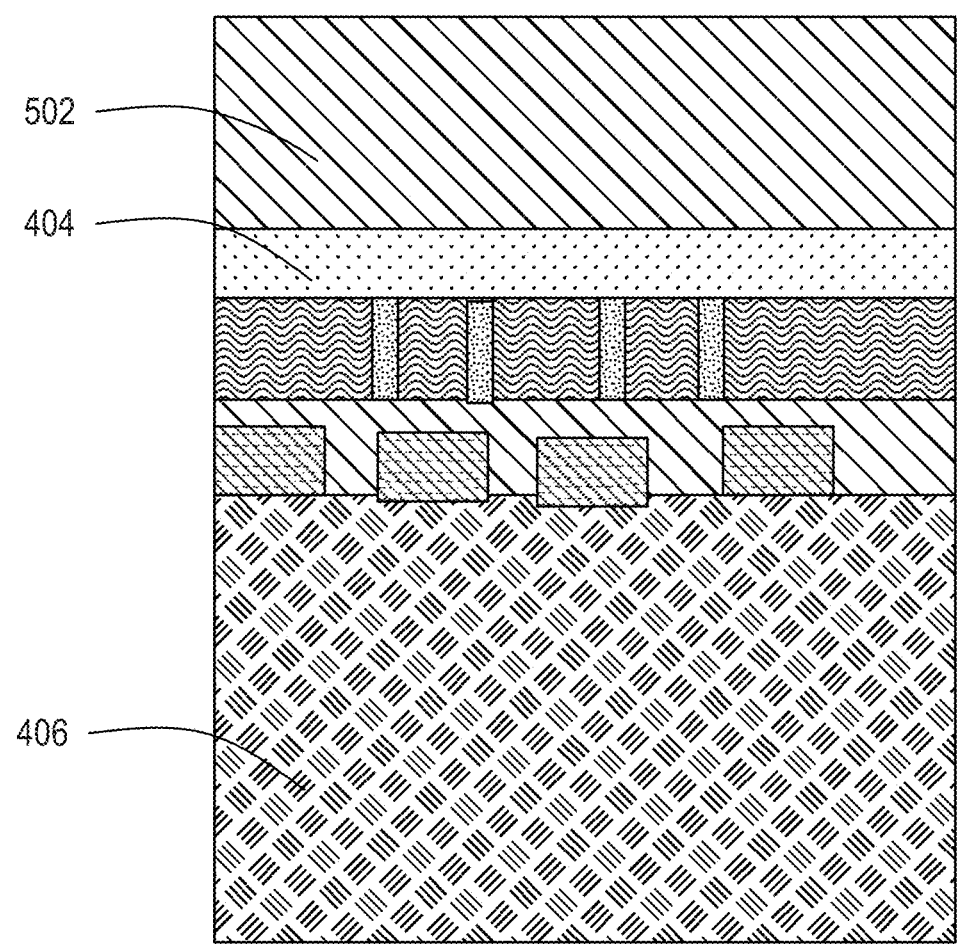
FIG. 5A illustrates a cross-section view of a device according to one or more embodiments.
Figure 5B:
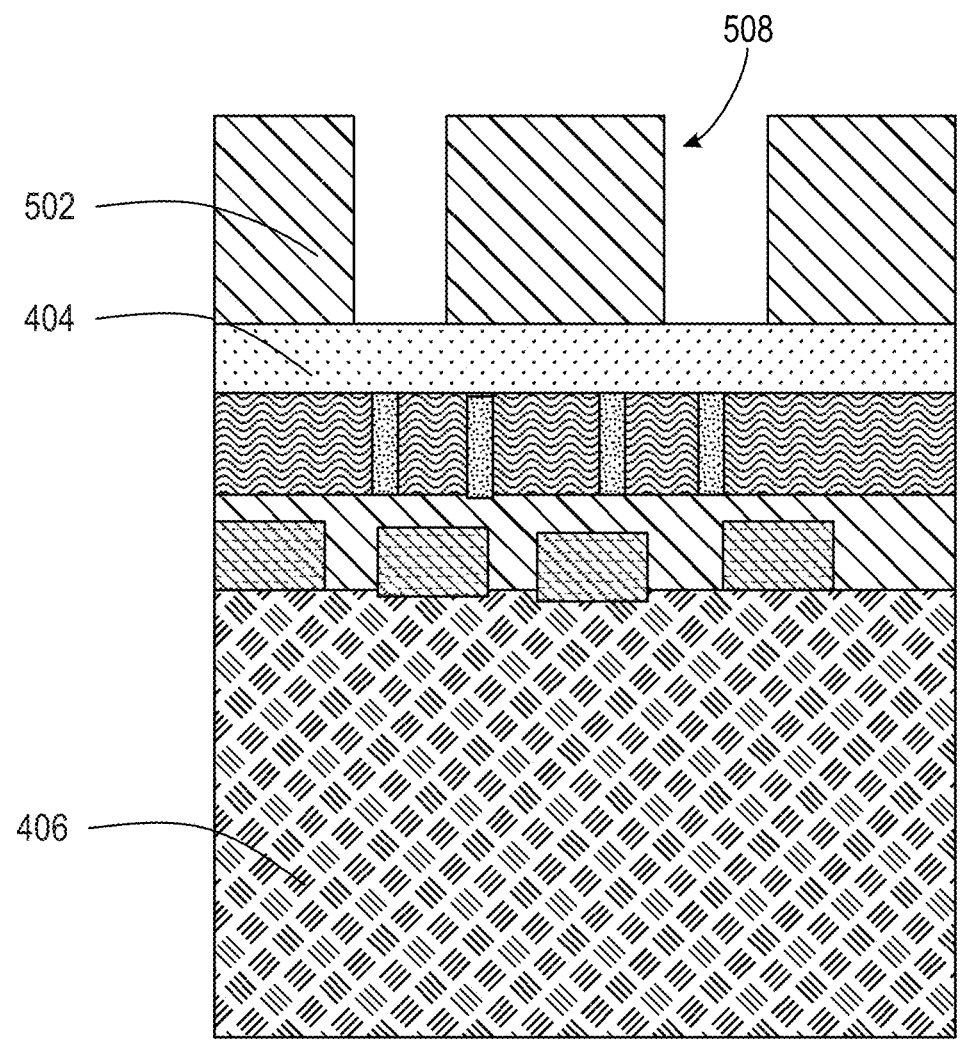
FIG. 5B illustrates a cross-section view of a device according to one or more embodiments.
Figure 5C:
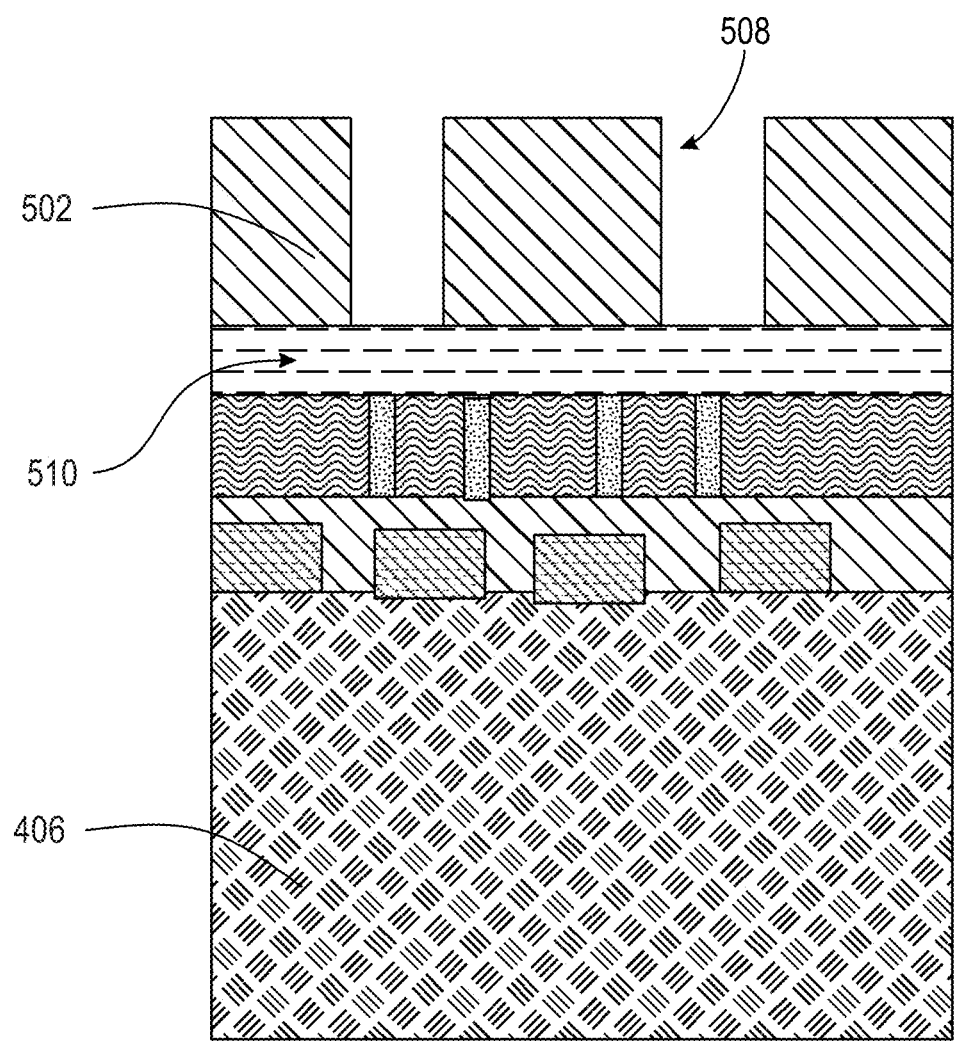
FIG. 5C illustrates a cross-section view of a device according to one or more embodiments.

At operation 82, referring to FIG. 3 and FIG. 5C, the buried etch stop layer 404 is selectively removed to form an opening 510. The buried etch stop layer 404 may be selectively removed by any suitable means known to the skilled artisan. In one or more embodiments, the buried etch stop layer 404 is selectively removed by etching the side of the device.

Figure 5D:
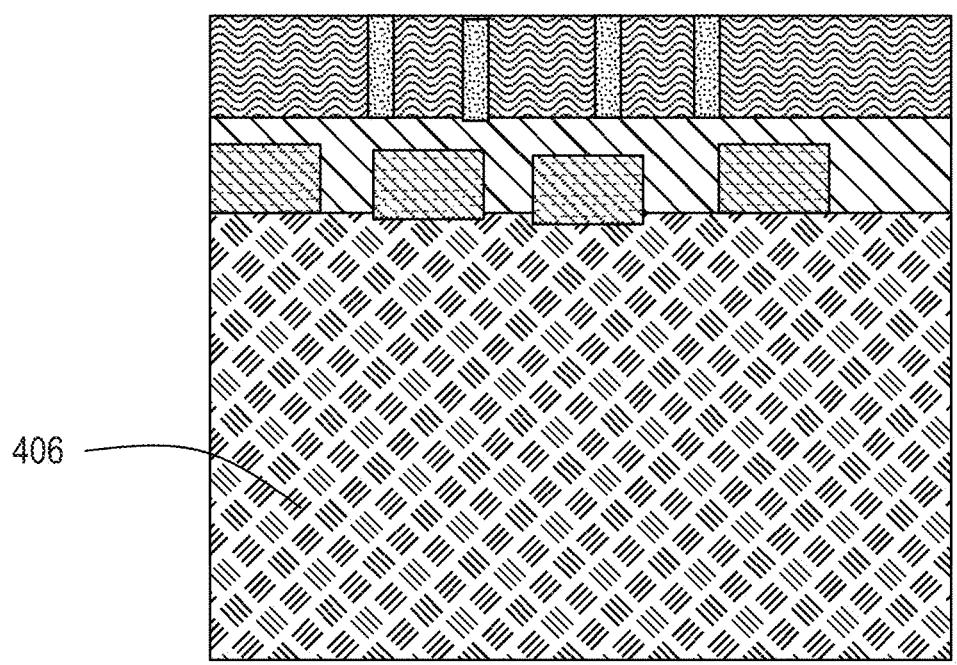
FIG. 5D illustrates a cross-section view of a device according to one or more embodiments.

With reference to FIG. 3 and FIG. 5D, at operation 84, the mask 502 with the vias 508 is lifted off the device. Liftoff may occur by any suitable means known to the skilled artisan. In one or more embodiments, liftoff allows for thinning of the wafer to a thickness in a range of from 50 nm to 100 nm. In one or more embodiments, the liftoff results in a thinned wafer that is substantially free of defects and scratches in the device 500. In one or more embodiments, liftoff requires lateral (istropic etch) of the sacrificial layer 120 across the wafer, which is achieved by Selectra® etching.

Figure 6:
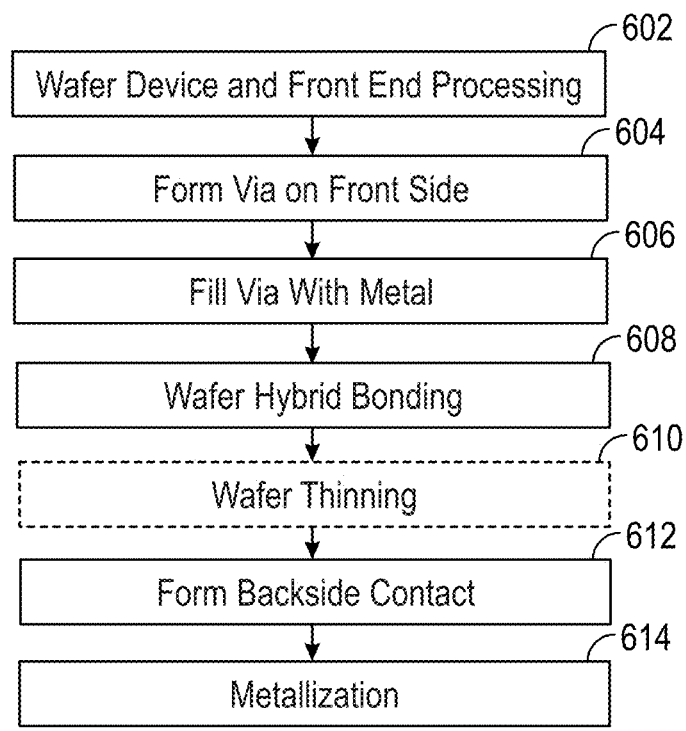
FIG. 6 illustrates a process flow diagram of a method according to one or more embodiments.

FIG. 6 illustrates a process flow diagram for a method 600 of fabricating a semiconductor device in accordance with some embodiments of the present disclosure. FIGS. 7A-7D depict the stages of forming a deep via and backside contact in accordance with some embodiments of the present disclosure. The method 600 is described below with respect to FIGS. 7A-7D. FIGS. 7A-7D are cross-sectional views of an electronic device (e.g., a GAA) 700 according to one or more embodiments. The method 600 may be part of a multi-step fabrication process of a semiconductor device. Accordingly, the method 600 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

FIGS. 7A-7D are the fabrication steps of operations 602 through 614 in FIG. 6. Referring to FIG. 6, the method 600 of forming a deep via and backside contact begins at operation 602. Referring to FIG. 6 and FIGS. 7A-7D, in the method 600 of one or more embodiments, transistors, e.g., gate-all-around transistors, are fabricated, at operation 602, using a standard process flow. The device 700 may be formed according to the methods described with respect to FIGS. 1A-1B and FIGS. 2A-2Q.

Figure 7A:
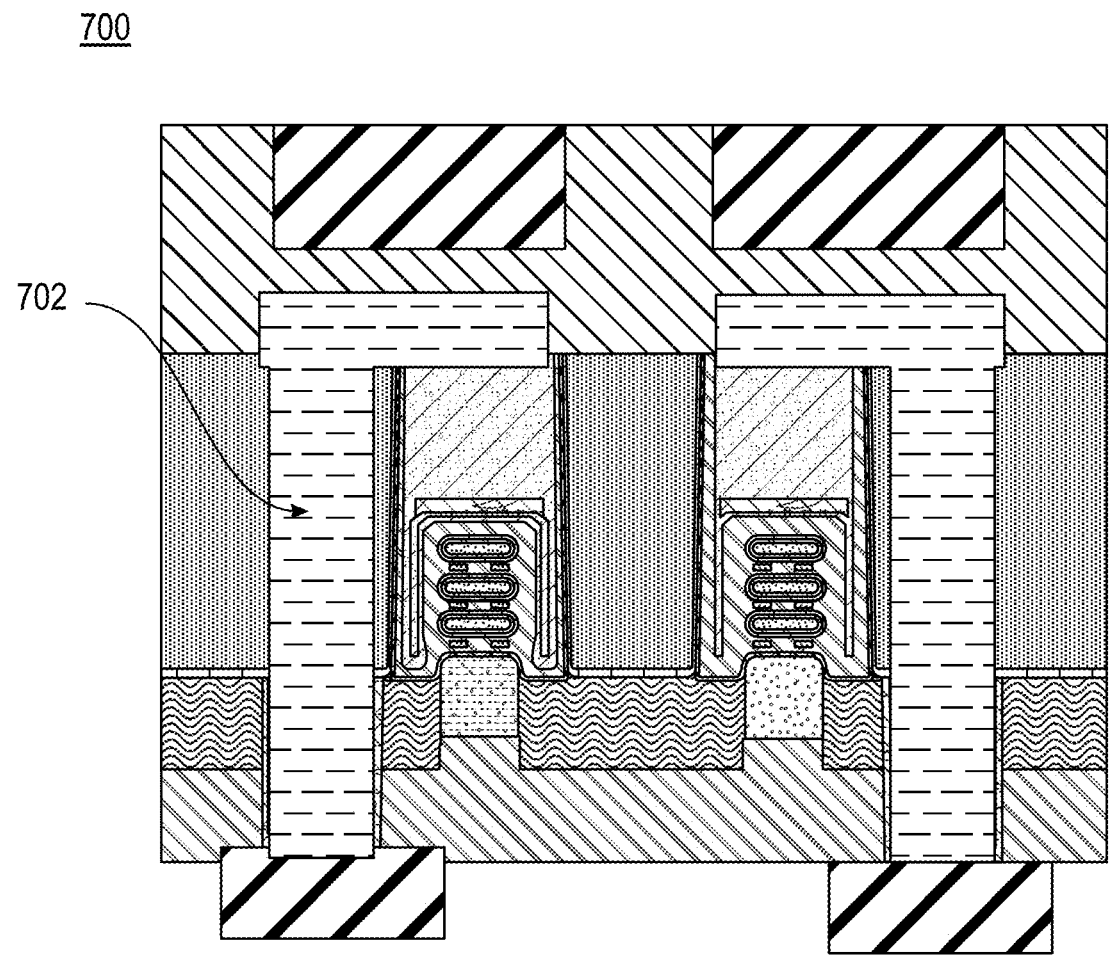
FIG. 7A illustrates a cross-section view of a device according to one or more embodiments.

At operation 604, as illustrated in FIG. 7A, at least one deep via 702 is formed in the frontside. The deep via 702 may have any suitable size or shape. The deep via 702 can have any suitable aspect ratio (ratio of the depth of the feature to the width of the feature). In some embodiments, the aspect ratio is greater than or equal to about 5:1, about 10:1, about 15:1, about 20:1, about 25:1, about 30:1, about 35:1 or about 40:1. In one or more embodiments, the critical dimensions of the deep via 702 are about 16 nm by about 16 nm, or about 10 nm by about 10 nm, or about 15 nm by about 15 nm, or about 20 nm by 20 nm.

Figure 7B:
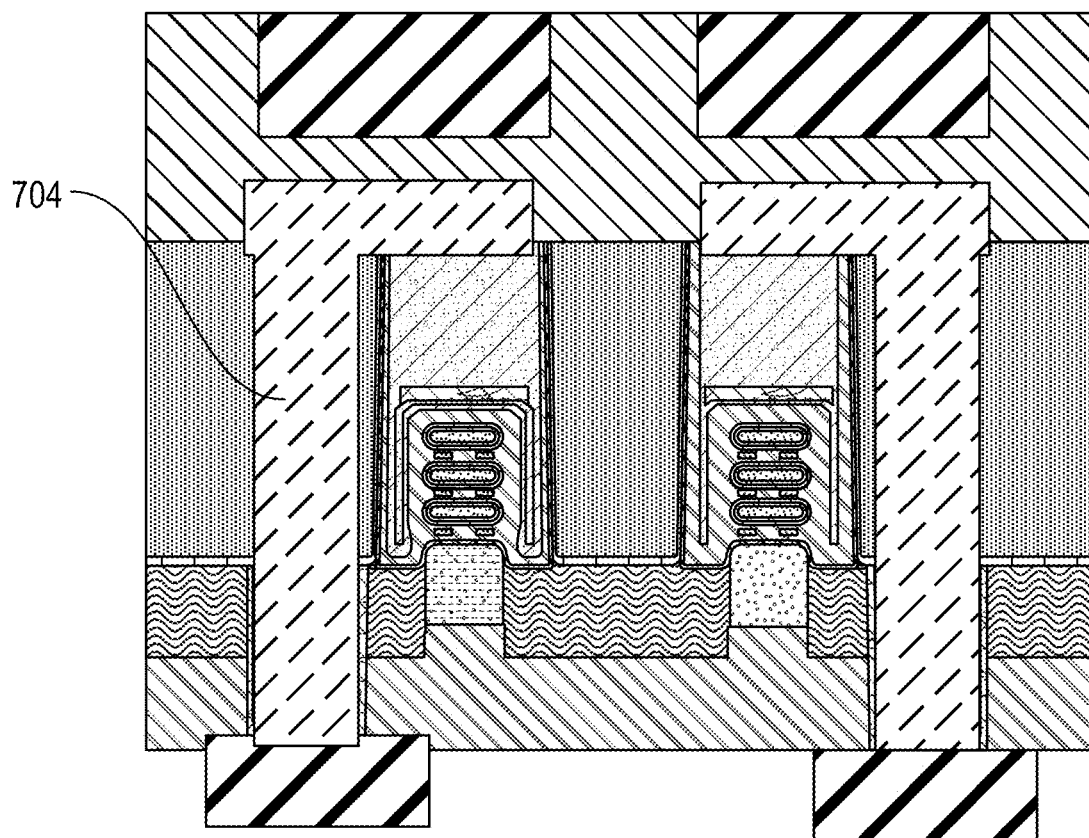
FIG. 7B illustrates a cross-section view of a device according to one or more embodiments.

Referring to FIG. 6 and FIG. 7B, at operation 606, the deep via 702 may be filled with a metal 704. The metal 704 may be any suitable metal known to the skilled artisan. In one or more embodiments, the metal 704 is selected from one or more of titanium (Ti), titanium nitride (TiN), tantalum (Ta), tantalum nitride (TaN), tungsten (W), molybdenum (Mo), cobalt (Co), copper (Cu), ruthenium (Ru), and the like.

Figure 7C:
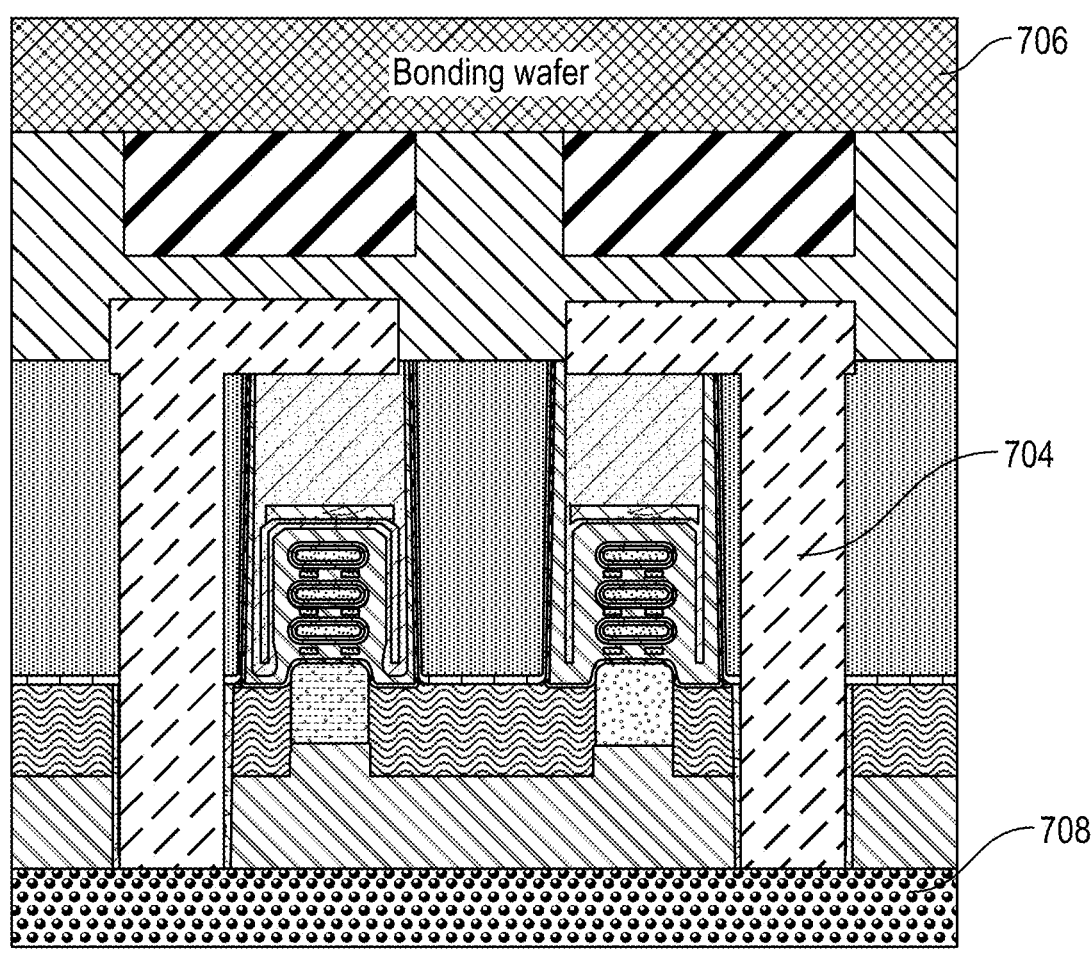
FIG. 7C illustrates a cross-section view of a device according to one or more embodiments.
Figure 7D:
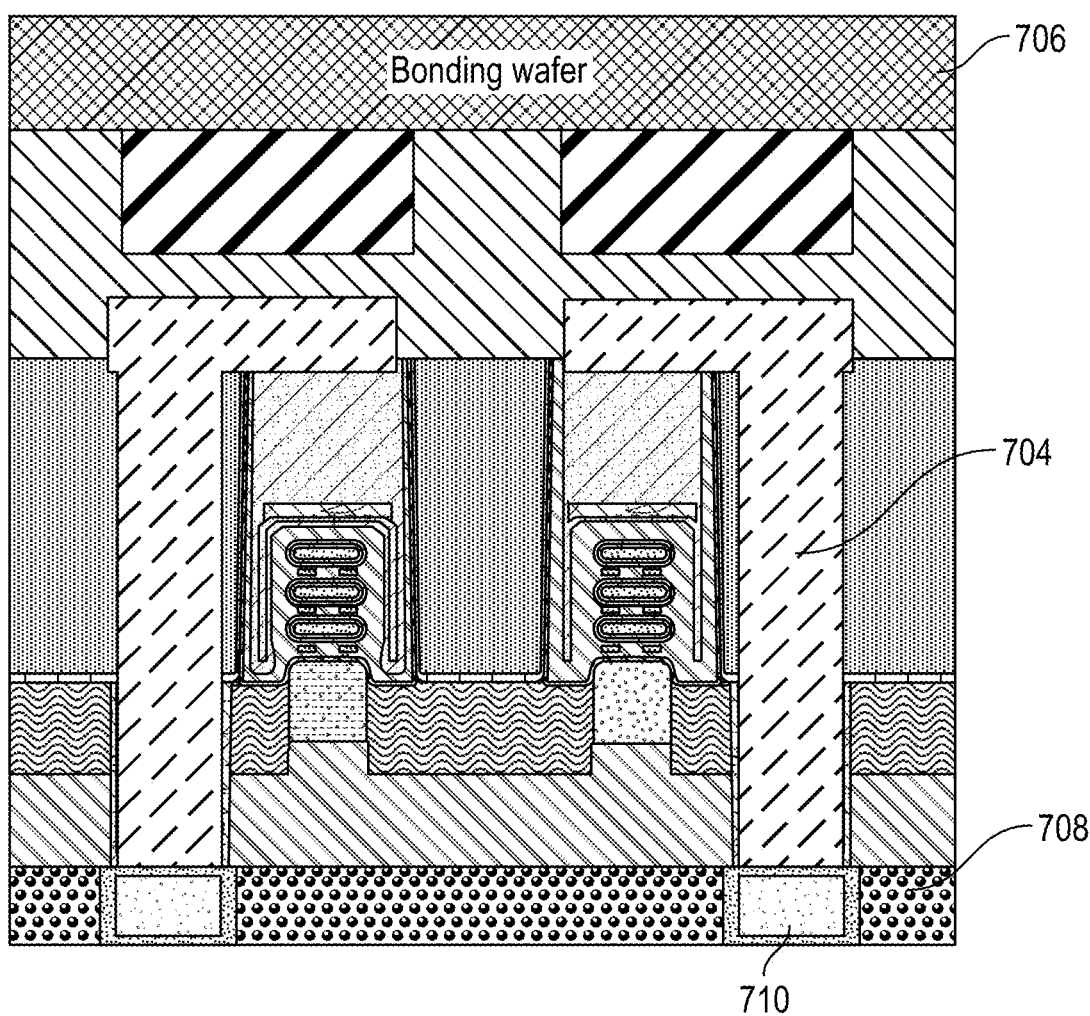
FIG. 7D illustrates a cross-section view of a device according to one or more embodiments.

With reference to FIG. 6 and FIG. 7C, at operation 608, a bonding wafer 706 is bonded to the front side. The substrate 708, at operation 610, may be optionally thinned according to the method(s) described above with respect to FIG. 3. At operation 612, as illustrated in FIG. 7D, a contact 710 is then formed to electrically connect to the metal 704 in the deep via 702. The contact 710 may comprise any suitable material known to the skilled artisan. In one or more embodiments, contact 710 comprises a metal selected from one or more of titanium (Ti), titanium nitride (TiN), tantalum (Ta), tantalum nitride (TaN), tungsten (W), molybdenum (Mo), cobalt (Co), copper (Cu), ruthenium (Ru), and the like. At operation 614, as illustrated in FIG. 7D, metallization then occurs.

In some embodiments, the methods are integrated such that there is no vacuum break. In one or more embodiments, the method 60 is the via etch (operation 80), removal of the buried sacrificial layer (operation 82) and the substrate release liftoff (operation 84), can be integrated such that there is no vacuum break between the operations.

Figure 8:
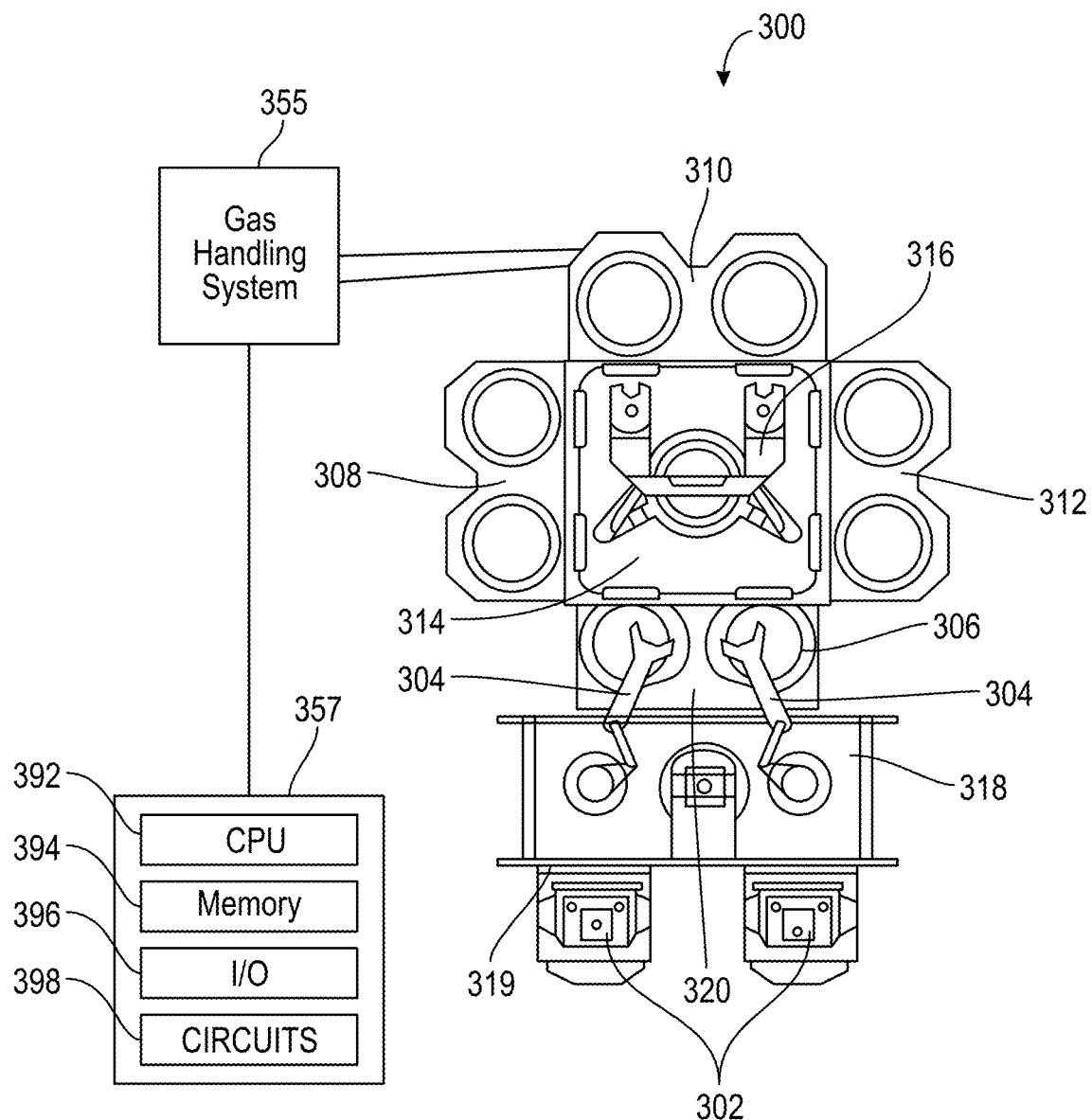
FIG. 8 illustrates a cluster tool according to one or more embodiments.

Additional embodiments of the disclosure are directed to processing tools 300 for the formation of the GAA devices and methods described, as shown in FIG. 8. A variety of multi-processing platforms as well as other processing systems may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a pre-clean chamber, a deposition chamber, an annealing chamber, an etching chamber, and the like. The particular arrangement of process chambers and components can be varied depending on the cluster tool and should not be taken as limiting the scope of the disclosure.

In the embodiment shown in FIG. 8, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the rapid thermal processing chamber to crystallize the template material.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a template deposition chamber and a template crystallization chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:
    forming a superlattice structure on a top surface of a substrate, the superlattice structure comprising a plurality of horizontal channel layers and a corresponding plurality of semiconductor material layers alternatingly arranged in a plurality of stacked pairs;
    forming a plurality of source trenches and a plurality of drain trenches adjacent to the superlattice structure on the substrate;
    expanding at least one of the plurality of source trenches and at least one of the plurality of drain trenches into a portion of the substrate, to form a source cavity and a drain cavity;
    depositing a sacrificial material in the source cavity and in the drain cavity;
    forming a source region and a drain region adjacent to a first end of the superlattice structure, wherein the source region and the drain region are formed in at least one of the plurality of source trenches and at least one of the plurality of drain trenches;
    forming a contact to a transistor (CT) and a contact to gate (CG) in electrical contact with the source region and the drain region;
    depositing an interlayer dielectric material on a bottom surface of the substrate;
    forming a backside power rail via in the interlayer dielectric material to form a damascene trench through the bottom surface of the substrate;
    at least partially removing the sacrificial material to form at least one opening extending to the damascene trench; and
    depositing a metal in the at least one opening and in the damascene trench.

2. The method of claim 1, wherein the expansion of at least one of the plurality of source trenches and at least one of the plurality of drain trenches comprises depositing a hard mask on at least one of the plurality of source trenches and on at least one of the plurality of drain trenches, and not depositing the hard mask on at least one of the plurality of source trenches and at least one of the plurality of drain trenches, and etching at least one of the plurality of source trenches and at least one of the plurality of drain trenches that do not have the deposited hard mask to form a source cavity and a drain cavity.

3. The method of claim 1, wherein the sacrificial material is fully removed.

4. The method of claim 1, wherein the sacrificial material comprises silicon germanium (SiGe).

5. The method of claim 4, wherein the silicon germanium (SiGe) has a germanium (Ge) content in a range of from 30% to 50%.

6. The method of claim 4, wherein the silicon germanium (SiGe) is doped with a dopant selected from a group consisting of boron (B), gallium (Ga), phosphorus (P), arsenic (As), and combinations thereof.

7. The method of claim 1, wherein forming the damascene trench further comprises etching the backside power rail via in the interlayer dielectric material deposed on the bottom surface of the substrate.

8. The method of claim 1, wherein the corresponding plurality of semiconductor material layers and the plurality of horizontal channel layers independently comprise one or more of silicon germanium (SiGe) and silicon (Si).

9. The method of claim 1, wherein forming the source region and the drain region comprises growing an epitaxial layer thereon.

10. The method of claim 1, wherein the source region and the drain region are independently doped with one or more of phosphorus (P), arsenic (As), boron (B), and gallium (Ga).

11. The method of claim 1, further comprising forming a gate structure on a top surface of the superlattice structure.

12. The method of claim 11, further comprising forming a dielectric layer on the gate structure and on the superlattice structure.

13. The method of claim 12, wherein the gate structure comprises one or more of tungsten (W), cobalt (Co), molybdenum (Mo), ruthenium (Ru), titanium nitride (TiN), tantalum nitride (TaN), titanium aluminum (TiAl), and n-doped polysilicon.

14. The method of claim 1, wherein the metal comprises one or more of titanium (Ti), titanium nitride (TiN), tantalum (Ta), tantalum nitride (TaN), tungsten (W), molybdenum (Mo), cobalt (Co), copper (Cu), and ruthenium (Ru).

15. A method of forming a semiconductor device, the method comprising:
  forming a superlattice structure on a top surface of a substrate, the superlattice structure comprising a plurality of horizontal channel layers and a corresponding plurality of semiconductor material layers alternatingly arranged in a plurality of stacked pairs;
  forming a gate structure on a top surface of the superlattice structure;
  forming a plurality of source trenches and a plurality of drain trenches adjacent to the superlattice structure on the substrate;
  expanding at least one of the plurality of source trenches and at least one of the plurality of drain trenches into a portion of the substrate to form a source cavity and a drain cavity;
  depositing a sacrificial material in the source cavity and in the drain cavity;
  forming an inner spacer layer on each of the plurality of horizontal channel layers;
  forming a source region and a drain region adjacent to a first end of the superlattice structure, wherein the source region and the drain region are formed in at least one of the plurality of source trenches and at least one of the plurality of drain trenches;
  forming an inter-layer dielectric layer on the top surface of the substrate including the source region, the drain region, and the gate structure;
  forming a replacement metal gate;
  forming a contact to a transistor (CT) and a contact to the gate (CG) in electrical contact with the source region and the drain region;
  forming a first metal line;
  rotating the formed semiconductor device 180 degrees so that the top surface of the substrate is flipped;
  planarizing a bottom surface of the flipped substrate;
  depositing an interlayer dielectric material on the bottom surface of the substrate;
  forming a backside power rail via in the interlayer dielectric material;
  expanding the backside power rail via toward the top surface of the substrate to form a damascene trench;
  removing the sacrificial material to form at least one opening; and
  depositing a metal in the at least one opening and in the damascene trench.

16. The method of claim 15, wherein the expansion of at least one of the plurality of source trenches and at least one of the plurality of drain trenches comprises depositing a hard mask on at least one of the plurality of source trenches and on at least one of the plurality of drain trenches, and not depositing the hard mask on at least one of the plurality of source trenches and at least one of the plurality of drain trenches, and etching at least one of the plurality of source trenches and at least one of the plurality of drain trenches that do not have the deposited hard mask to form a source cavity and a drain cavity.

17. The method of claim 15, wherein the sacrificial material comprises silicon germanium (SiGe).

18. The method of claim 17, wherein the silicon germanium (SiGe) has a germanium (Ge) content in a range of from 30% to 50%.

19. The method of claim 17, wherein the silicon germanium (SiGe) is doped with a dopant selected from a group consisting of boron (B), gallium (Ga), phosphorus (P), arsenic (As), and combinations thereof.

20. The method of claim 15, wherein forming the source region and the drain region comprises growing an epitaxial layer thereon.

* * * * *